United States Patent [19]

Arikawa et al.

[11] Patent Number: 5,386,108
[45] Date of Patent: Jan. 31, 1995

[54] PHOTOELECTRIC CONVERSION DEVICE FOR AMPLIFYING AND OUTPUTTING PHOTOELECTRICALLY CONVERTED SIGNAL, AND A METHOD THEREOF

[75] Inventors: Shiro Arikawa, Hiratsuka; Isamu Ueno, Hadano; Toshiki Nakayama, Atsugi, all of Japan

[73] Assignee: Canon Kabushiki Kaisha, Tokyo, Japan

[21] Appl. No.: 80,499

[22] Filed: Jun. 24, 1993

[30] Foreign Application Priority Data

Jun. 25, 1992 [JP] Japan .................................. 4-190303

[51] Int. Cl.⁶ .............................................. H01J 40/14
[52] U.S. Cl. .................................. 250/208.1; 348/307
[58] Field of Search .......................... 250/208.1, 578; 357/443, 444, 448; 358/212, 212.12, 212.13, 212.26, 212.27, 212.29, 212.31; 348/307–309

[56] References Cited

U.S. PATENT DOCUMENTS

| | | | |
|---|---|---|---|
| 3,660,667 | 5/1972 | Weimer | 250/209 |
| 4,712,138 | 12/1987 | Kyuma et al. | 358/213.31 |
| 4,737,832 | 4/1988 | Kyuma . | |
| 4,743,955 | 5/1988 | Matsumoto . | |
| 4,791,469 | 12/1988 | Ohmi et al. . | |
| 4,794,443 | 12/1988 | Tanaka et al. . | |
| 4,868,405 | 9/1989 | Nakamura | 250/578 |
| 4,962,412 | 10/1990 | Shinohara et al. . | |
| 5,014,132 | 5/1991 | Kumesawa et al. | 358/213.31 |
| 5,124,544 | 6/1992 | Ohzu . | |
| 5,162,912 | 11/1992 | Ueno et al. | 358/213.29 |

FOREIGN PATENT DOCUMENTS 0277016 8/1988 European Pat. Off. .
0434215 11/1990 European Pat. Off. .
0400985 12/1990 European Pat. Off. .

*Primary Examiner*—David C. Nelms
*Attorney, Agent, or Firm*—Fitzpatrick, Cella, Harper & Scinto

[57] ABSTRACT

A photoelectric conversion device comprising a photoelectric conversion cell, as an individual pixel, comprises a first transistor having a control electrode region consisting of a semiconductor of one conduction type, and first and second main electrode regions consisting of a semiconductor of opposite conduction type of the one conduction type, for outputting a signal from the first main electrode region based on carriers transferred to the control electrode region, a carrier storage region provided adjacent the first transistor, consisting of a semiconductor of the one conduction type for storing carriers generated by light energy being received, and a second transistor, with the carrier storage region and the control electrode region of the transistor as the source and drain regions, for transferring carriers stored in the carrier storage region to the control electrode region of the transistor.

10 Claims, 19 Drawing Sheets

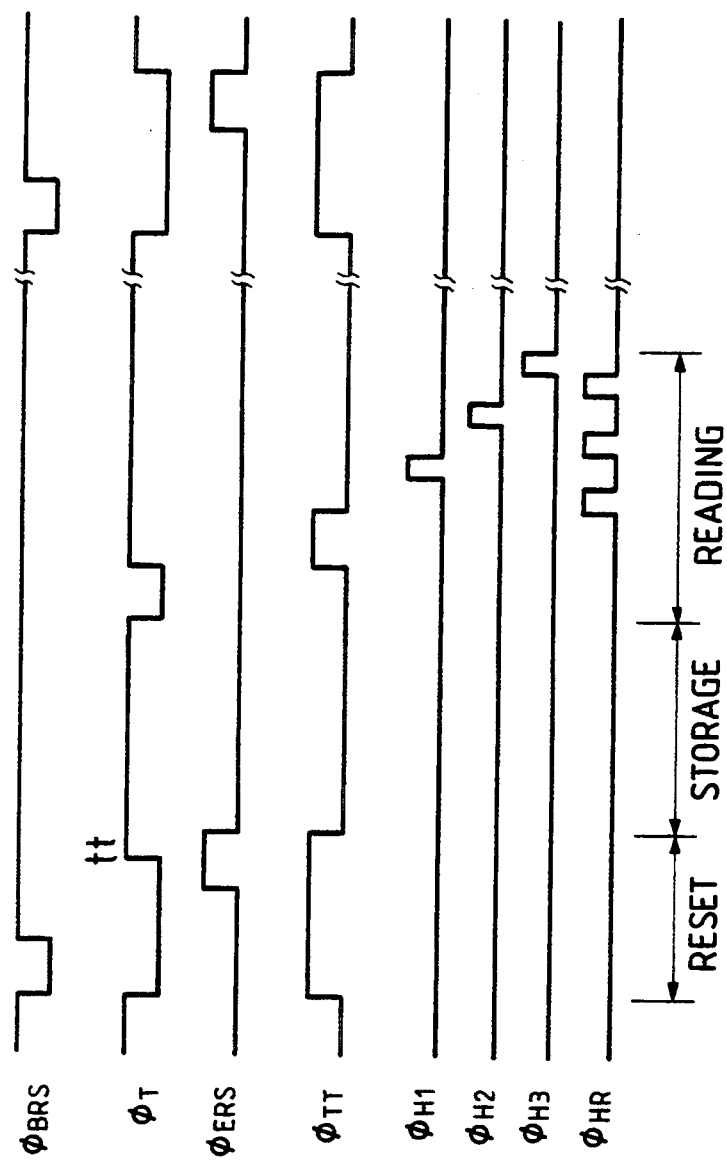

5,386,108

PHOTOELECTRIC CONVERSION DEVICE FOR AMPLIFYING AND OUTPUTTING PHOTOELECTRICALLY CONVERTED SIGNAL, AND A METHOD THEREOF

BACKGROUND OF THE INVENTION

1. Field of the Invention

The present invention relates to a photoelectric conversion device and a photoelectric conversion method, and more particularly to a photoelectric conversion device using a photoelectric conversion element of the amplification type capable of amplifying and outputting a photoelectrically converted signal with a transistor component, and a photoelectric conversion method thereof.

2. Related Background Art

Recently, photoelectric conversion elements of the amplification type capable of amplifying and outputting a photoelectrically converted signal have gained wide attention, because with the higher definition of photoelectric conversion elements, the output of photoelectrically converted signal may be reduced. Among such photoelectric conversion elements of the amplification type is a photoelectric conversion element having the same constitution as a unipolar or bipolar transistor, in which electric charge generated by light illumination is stored in the base or gate region which is a control electrode region, and an amplified signal is output from the source or emitter region which is a main electrode region.

FIG. 27 is a plan view showing a pixel using a conventional bipolar sensor. In this figure, 21 is an emitter region, 22 is an output line made of AL or the like, 23 is a contact hole connecting the emitter region 21 with the output line 22, 24 is a base region for storing photoelectric charges, 25 is a drive line made of poly-Si or the like for effecting the sensor action of pixel, 26 is a capacity $C_{OX}$ formed between the base region 24 and the drive line 25, and 27 is a gate electrode of p-type MOS transistor which is formed with the base regions 24 of adjacent pixels as source and drain regions, consisting of a part of the drive line 25, and 28 is a thick oxide film for the separation between pixels.

FIG. 28 is a cross-sectional view of FIG. 27, taken along the line X-X', and FIG. 29 is a cross-sectional view of FIG. 27, taken along the line Y-Y'. In FIGS. 28 and 29, 29 is a thin oxide film, 30 is an $n^{30}$ layer of high impurity concentration provided for the separation between pixel signals in the Y-Y' direction, 31 is an $n^{31}$ layer of low impurity concentration in which a depletion layer is spread, 32 is a collector region, and 33 is a layer insulation film for the separation between wirings 22, 25.

Note that as shown in FIG. 28, a p-type MOS transistor M for the reset (a region encircled by the broken line in the figure) is formed in a horizontal separation region of each pixel. If the gate of p-type MOS transistor M is turned on, the base region 24 of an adjacent pixel conducts, so that a reset is effected. On the contrary, if the gate is off, the p-type MOS transistor M serves as a pixel separation region.

Further, FIG. 30 is an equivalent circuit diagram of a two-dimensional photoelectric conversion device in which the pixels are arranged in two dimensions.

In FIG. 30, 41 is a pixel consisting of a bipolar sensor (or equivalently a bipolar transistor) T, a capacitor $C_{OX}$ connecting to the base, and a p-type MOS transistor M, 42 is a vertical output line connecting the emitters of pixels 41, 43 is a MOS transistor for resetting the vertical output line 42, 44 is a storage capacitor for storing an output signal from the pixel 41, 45 is a MOS transistor for transferring the output signal to the storage capacitor 44, 46 is a MOS transistor for receiving the output of a horizontal shift register and transferring an output signal to a horizontal output line 47, 48 is a MOS transistor for resetting the horizontal output line 47, 49 is a preamplifier, 50 is a horizontal drive line, 51 is a buffer MOS transistor for receiving the output of a vertical shift register and passing a sensor drive pulse therethrough, 52 is an emitter follower circuit for setting the source voltage of p-type MOS transistor to effect clamp operation of the pixel 41, 53 is a p-type MOS transistor for setting the base voltage of the emitter follower circuit 52, 54 is a terminal for applying pulses to the gate of MOS transistor 43, 55 is a terminal for applying pulses to the gate of transfer MOS transistor 45, 56 is a terminal for applying sensor drive pulses, 57 is a terminal for applying pulses to the gate of p-type MOS transistor 53, and 58 is an output terminal connecting to the preamplifier 49.

A two-dimensional solid-state image pickup device as shown in FIG. 30 is of the type in which all the pixels are reset at a time, and is useful for the still video and so on.

The operation thereof will be described below.

First, the p-type MOS transistor 53 is turned on and the output of emitter follower circuit 52 is made at a positive voltage, by applying a low-level pulse to the terminal 57 of FIG. 30. The output of this emitter follower circuit 52 is connected to the sources of p-type MOS transistors M for the pixels 41, wherein if the source voltage is higher enough than the gate voltage to fully turn on the p-type MOS transistor M, holes are injected into the base of bipolar sensor T for the pixel through the p-type MOS transistor M.

Then, a high-level pulse is applied to the terminal 57, so that the p-type MOS transistor 53 is turned off, and the output of the emitter follower circuit 52 is grounded.

Then, a high-level pulse is applied to the terminal 54 of FIG. 30, so that the transistor 43 is turned on, and the vertical output line 42 is grounded (referred to as a first reset).

Then, the vertical shift register is driven while in this state, and a reset pulse of pixel is applied to the terminal 56, so that pixels are reset sequentially from one row to another, and the bases of bipolar sensors T for all the pixels are placed at a constant voltage and reverse-biased (referred to as a second reset).

After the storage operation of light carriers is carried out, a low-level pulse is applied to the terminal 54 of FIG. 30, so that the MOS transistor 43 is turned off. For each row selected by the output of vertical shift register, a read pulse is applied from the terminal 56, whereby a signal output is stored through the MOS transistor 45 in the storage capacitor 44. The signal output stored in the storage capacitor 44 is transferred through the transfer MOS transistor 46 selected by the horizontal shift register to the horizontal output line 47, and output through the preamplifier 49 to the output terminal 58.

First of all, a first problem with the conventional photoelectric conversion element will be described below.

The photoelectric conversion element has been utilized in practice as the sensor element for camera or FAX by virtue of its superior photoelectric conversion characteristics. However, with minuter confirguration of sensor elements, (1) Reduced number of light generated carriers with decreased light receiving area, and
(2) Lower capacity division ratio with increased parasitic capacity component take place, and as a result, the signal component decreases, and the S/N ratio is lowered.

Accordingly, to proceed with more minute structure, it is necessary that the signal component be maintained as large as possible. There is the following relation between the sensitivity of photoelectric conversion element and the parasitic capacity:

Expression 1

$$S = \frac{I_p \cdot A_e \cdot t_s}{C_{bc} + C_{OX}} \cdot \frac{1}{1 + \frac{C_T + C_{vl}}{(C_{bc} + C_{OX})h_{FE}}}$$

$$= \frac{I_p \cdot A_e \cdot t_s}{C_{bc} + C_{OX}} \cdot \frac{h_{FE}(C_{bc} + C_{OX})}{(C_T + C_{vl}) + (C_{bc} + C_{OX})h_{FE}}$$
(1)

S: Sensitivity
$I_p$: Photocurrent generating density
$A_e$: Opening area
$t_s$: Storage time
$C_{OX}$: Overlap capacity between MIS gate electrode and control electrode
$C_{bc}$: Base-collector junction capacity
$h_{FE}$: Current amplification factor of Tr
$C_T$: Temporary charge stored capacity
$C_{vl}$: Parasitic capacity on the vertical line As will be clear from the expression (1), to obtain the greatest sensitivity, it is desirable to make $C_{bc}+C_{ox}$ as small as possible in the former term and to make $C_{vl}+C_T$ as small as possible and $C_{bc}+C_{OX}$ as large as possible in the latter term, providing that the opening area, the photocurrent generating density, the storage time and $H_{FE}$ are fixed. When the pixel size is relatively large, the degree of freedom for the layout is high and each capacity value can be easily controlled, whereby the sensitivity could be rendered sufficiently high. However, if the pixel size becomes smaller with further progress of more minute construction, the degree of freedom for the layout decreases due to process constraint such as alignment precision or increased junction capacity component, and reduced opening ratio. On the device operation, the value of $C_T$ has a lower limit, due to constraint in finally reading the value, and the value of $C_{OX}$ has a lower limit from the point of determining the saturation voltage, and an upper limit from the point of maintaining the opening ratio. Also, the value of $C_{bc}$ has an inconsistent requirement that it should be smaller to make the base voltage in reading as high as possible, and be greater to provide the least voltage drop due to capacity division with the reading operation. Accordingly, to provide the greatest sensitivity, it is desirable that the values of $C_{OX}$, $C_T$ are determined from the operational requirements, $C_{bc}$ is set at an optimal value, and $C_{vl}$ is set at minimum, whereas in the conventional structure, $C_{be}$, a main factor for determining $C_{vl}$, which is determined by the emitter size, can hereby be decreased, so that there was a tendency that the sensitivity would decrease with smaller pixel size.

Next, a second problem of the conventional photoelectric conversion element will be described below.

For the two-dimensional photoelectric conversion device as shown in FIG. 30, the first reset is performed at the same time, as already described, but the subsequent second reset operation that the base of bipolar sensor T for the pixel is placed at a fixed voltage and reverse-biased, is effected sequentially for each pixel from one row to another, so that the start of storage operation takes place at different times for the pixels in each row. Also, the storage operation is terminated immediately before the start of reading operation, but the reading operation is made sequentially for each pixel from one row to another, so that the termination of storage operation takes place at different times for the pixels in each row.

Accordingly, a certain drift may arise at the start and termination time of storage operation from one row to another, when a fast motion picture is picked up, so that the output image may be distorted. In particular, when the motion picture is read as a still image, this tendency is more noticeable.

SUMMARY OF THE INVENTION

The first problem as mentioned above is solved by the photoelectric conversion device comprising a photoelectric conversion cell, as an individual single pixel, comprising a first transistor having a control electrode region consisting of a semiconductor of one conduction type, and first and second main electrode regions consisting of a semiconductor of an opposite conduction type of the one conduction type, for outputting a signal from the first main electrode region based on carriers transferred to the control electrode region, a carrier storage region provided adjacent the first transistor, consisting of a semiconductor of the one conduction type for storing carriers generated by light energy being received, and a second transistor, with the carrier storage region and the control electrode region of said transistor as the source and drain regions, for transferring carriers stored in the carrier storage region to the control electrode region of the transistor.

The present invention relates to a photoelectric conversion method for a photoelectric conversion using, a device according to the first invention as above described, comprising a photoelectric conversion cell, as an individual single pixel, and comprising a first transistor having a control electrode region consisting of a semiconductor of one conduction type, and first and second main electrode regions consisting of a semiconductor of an opposite conduction type of the one conduction type, for outputting a signal from said first main electrode region based on carriers transferred to said control electrode region, a carrier storage region provided adjacent the first transistor, consisting of a semiconductor of the one conduction type for storing carriers generated by light energy being received, and an insulated gate transistor as a second transistor, with the carrier storage region and the control electrode region of the transistor as the source and drain regions, for transferring carriers stored in the carrier storage region to the control electrode region of the transistor, characterized by including a first reset operation for setting the carrier storage region and the control electrode region to their initial voltages by allowing the second transistor to conduct, a storage operation for storing carriers generated by light illumination in said carrier storage region, an operation for transferring carriers stored in one of said carrier storage regions to the control electrode region, by allowing one of said second transistors to conduct, a reading operation for reading the voltage of the control electrode region uniquely determined by transferred carriers, and a second reset operation for initializing the voltage of said control electrode region after reading.

The present invention has solved the second problem as above described, and provides a photoelectric conversion device comprising a plurality of photoelectric conversion cells having light signal storing means for storing carriers generated by light energy being received, light signal holding means for holding carriers transferred from said light signal storing means, a first switch means for controlling the conduction between said light signal storing means and the light signal holding means, and a second switch means for connecting the light signal storing means with a predetermined voltage source, first control means for operating the first switch means collectively for all the photoelectric conversion cells, and second control means for operating the second switch means collectively for all the photoelectric conversion cells, characterized in that said first control means transfers carriers from the light signal storing means to the light signal holding means, and the second control means resets the light signal storing means at a predetermined voltage.

The present invention seeks to contribute to further advancement in the microstructure of a photoelectric conversion device, as shown in FIGS. 27 to 30. In contrast to a conventional constitution in which a transistor is provided for each pixel, light generated carriers are stored in the control electrode region, and a signal is read from one of the main electrode regions adjacent said control electrode region, the present invention is configured such that the carrier storage region for storing light generated carriers is provided separately from the control electrode region of transistor for use with the reading operation, and carriers stored in said carrier storage region are transferred to said control electrode region. Herein, if the carrier storage region is arranged in linear symmetry with the control electrode region, the number of main electrodes for the output of signal is one-half the conventional number, i.e., one main electrode is commonly used for two pixels, and the value of $C_{vl}$ can be about 50 to 70% of the conventional value. Also, by shifting the main electrode region for the output of signal, conventionally existing in the central portion of one pixel, to a separation portion of the pixel, the effective opening area is increased by about 20 to 30%. The accumulation of such effects will improve the sensitivity.

The present invention includes
1) First reset operation to set a plurality of carrier storage regions and control electrode regions to their initial voltages,
2) Subsequent storage operation to store carriers generated by light illumination in carrier storage regions,
3) Subsequent transfer operation to transfer carriers stored in one of the carrier storage regions to a control electrode region by allowing one of a plurality of insulated gate transistors to conduct,
4) Subsequent reading operation to read the voltage of control electrode region uniquely determined by transferred carriers,
5) Second reset operation after reading to initialize the voltage of said control electrode region,
6) Repeating each operation of transfer, reading and reset, according to the operations of 3) to 5), for other carrier storage regions.

The present invention provides a photoelectric conversion device comprising a plurality of photoelectric conversion cells, each at least having light signal storing means for storing carriers, light signal holding means for holding carriers from said light signal storing means, a first switch means for controlling the conduction between said light signal storing means and said light signal holding means, and a second switch means for connecting said light signal storing means to a predetermined voltage source, wherein the start and termination of storing operation are made coincident for all the pixels by starting the storing operation after resetting said light signal storing means to a predetermined voltage collectively for all the photoelectric conversion cells, as well as terminating the storing operation by allowing the first control means to transfer carriers from said light signal storing means to said light signal holding means collectively for all the photoelectric conversion cells. Note that the reset of said light signal holding means may be done concurrently with or independently of the reset of light signal storing means.

BRIEF DESCRIPTION OF THE DRAWINGS

FIGS. 26A and 26B are schematic views for explaining the operation of the photoelectric conversion device in FIGS. 25A to 25C.

DETAILED DESCRIPTION OF THE PREFERRED EMBODIMENTS

Figure 24A:
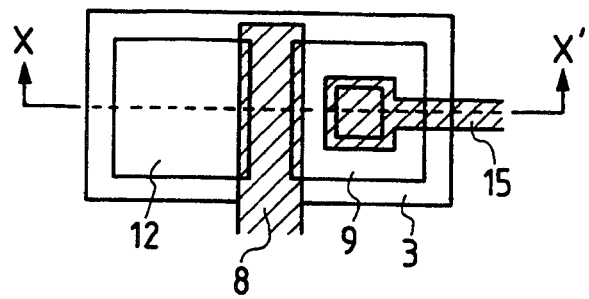
FIGS. 24A to 24C are schematic views for explaining a photoelectric conversion device according to an embodiment of the present invention.
Figure 24B:
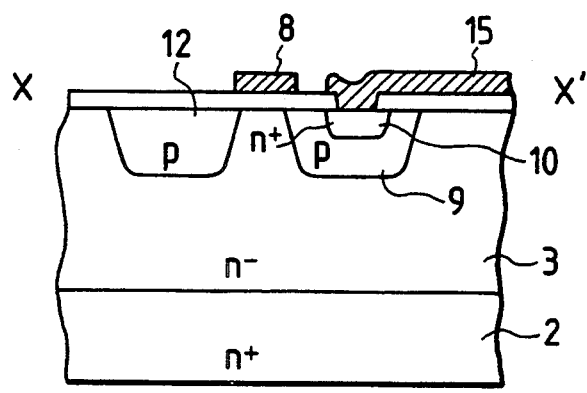
Figure 24C:
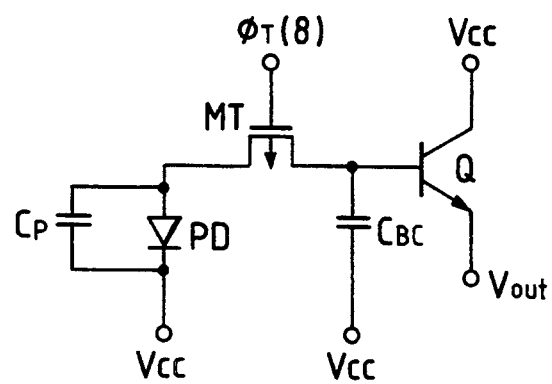

FIGS. 24A to 24C are schematic views showing one embodiment of the present invention, FIG. 24A shows an upper face of a photoelectric conversion device, FIG. 24B shows a cross section taken along the line X-X', and FIG. 24C shows an equivalent circuit. A light receiving portion is constituted of a photodiode PD having a P region 12 and an n− region 3, and a first transistor is constituted of a bipolar transistor Q with an n+ region 2 and an n− region 3 as the collector, a p region 9 as the base, and an n region 10 as the emitter.

And the photodiode PD and the bipolar transistor Q selectively conduct through two p regions 9, 12 with a pMOS transistor MT as a second transistor interposed therebetween. Herein, $C_p$ is a storage capacitor, $C_{BC}$ is a base-collector capacitor, and $V_{CC}$ is a reference voltage source for supplying the voltage for reverse-biasing the collector, and a cathode of the photodiode.

The basic operation will be described below. If the transistor MT is off and light is incident upon the photodiode, holes are stored in the p region 12. Next, the transistor MT is turned on so that light charges are transferred to the p region 9 as base. After the transistor MT is turned off again, an amplified signal is taken out of the emitter based on carriers stored in the base.

The first transistor for use in the present invention may be a bipolar transistor or a unipolar transistor. In particular, the latter is preferably FET or SIT having a junction gate.

The second transistor for use in the present invention is preferably an insulated gate transistor, and in particular desirably a MOS transistor.

Further, the first and second transistors are preferably shielded from light in part thereof.

And if a plurality of photodiodes are provided for one first transistor, the sensitivity can be improved with higher opening ratio.

Figure 25A:
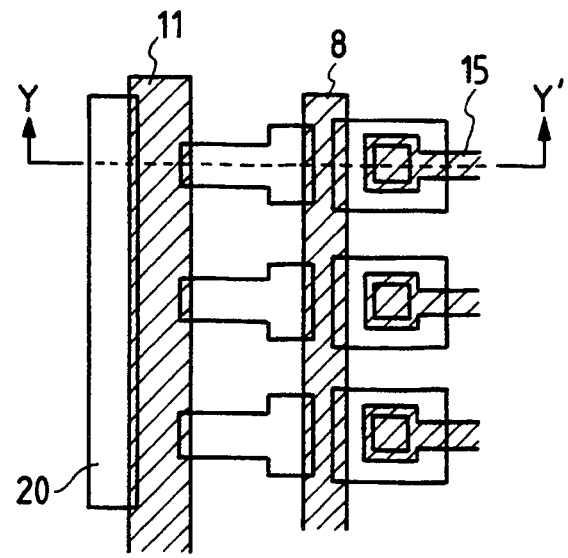
FIGS. 25A to 25C are schematic views for explaining a photoelectric conversion device according to another embodiment of the present invention.
Figure 25B:
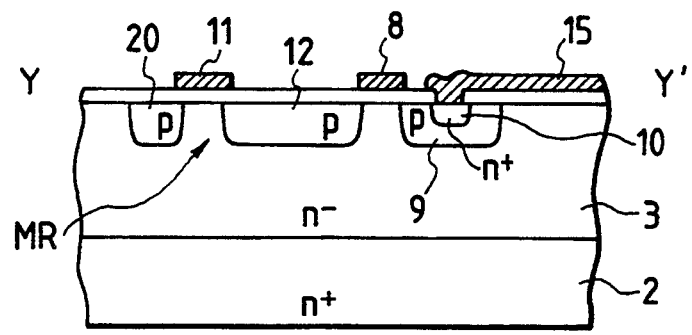
Figure 25C:
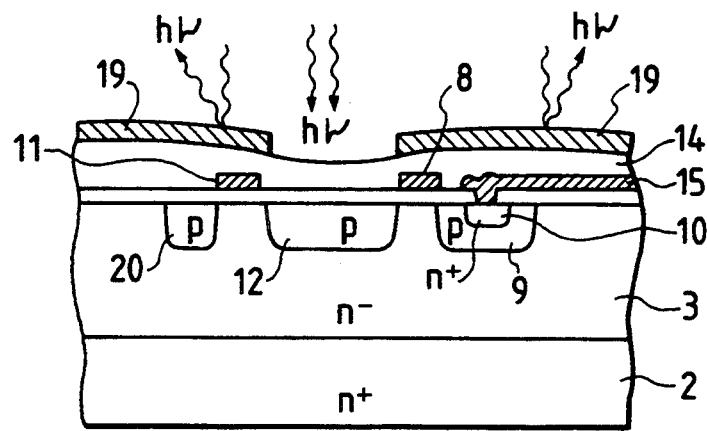

FIGS. 25A to 25C are device (line sensor) having three pixels arranged in an array, with a photoelectric conversion device of FIGS. 24A to 24C as one pixel. In addition to the configuration of FIGS. 24A to 24C, this pixel further comprises a reset transistor as the third transistor.

The third transistor MR is a pMOS transistor having the p regions 12, 20 as source and drain and a gate electrode indicated by 11, a p region 20 being carried on a reference voltage for the reset.

In this case, it is preferable that the region except for photodiode is shielded from light by a light shielding layer provided via an insulation layer 14, as shown in FIG. 25B.

In an embodiment of FIGS. 25A to 25C, it is desirable to turn on the pMOS transistor MR and reset the photodiode by applying a negative voltage to the gate electrode 11 before storing operation in the embodiment of FIGS. 24A to 24C.

Figure 26A:
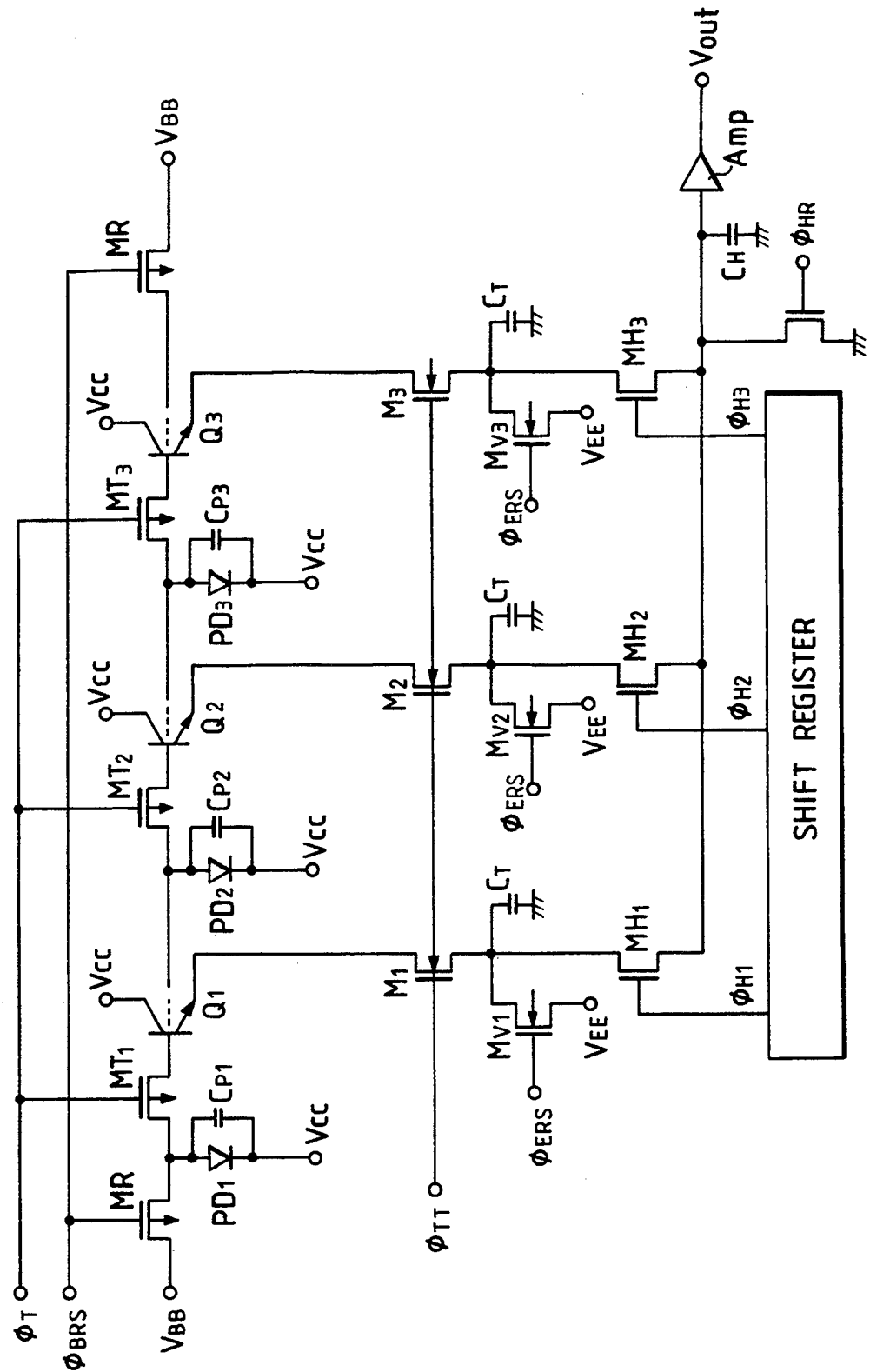
Figure 27:
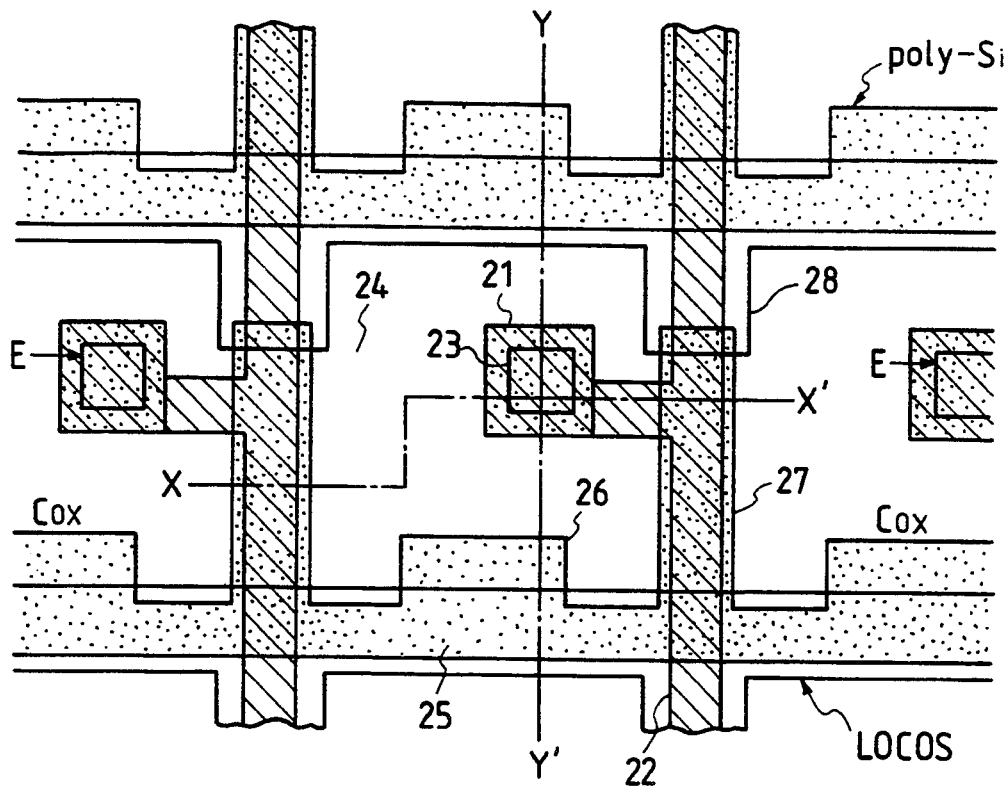
FIG. 27 is a plan view of pixel using a conventional bipolar sensor.
Figure 28:
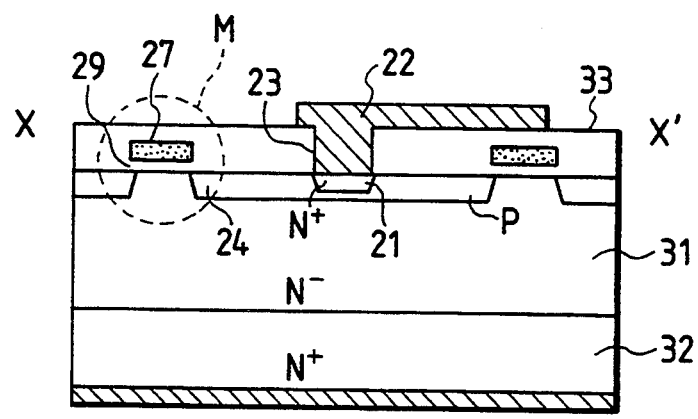
FIG. 28 is a cross-sectional view of FIG. 27 taken along the line X-X'.
Figure 29:
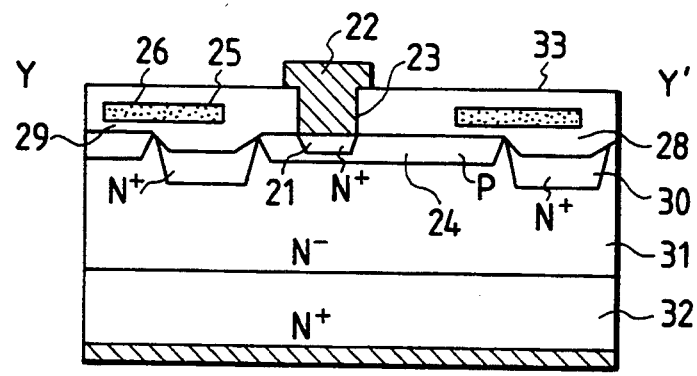
FIG. 29 is a cross-sectional view of FIG. 27 taken along the line Y-Y'.
Figure 30:
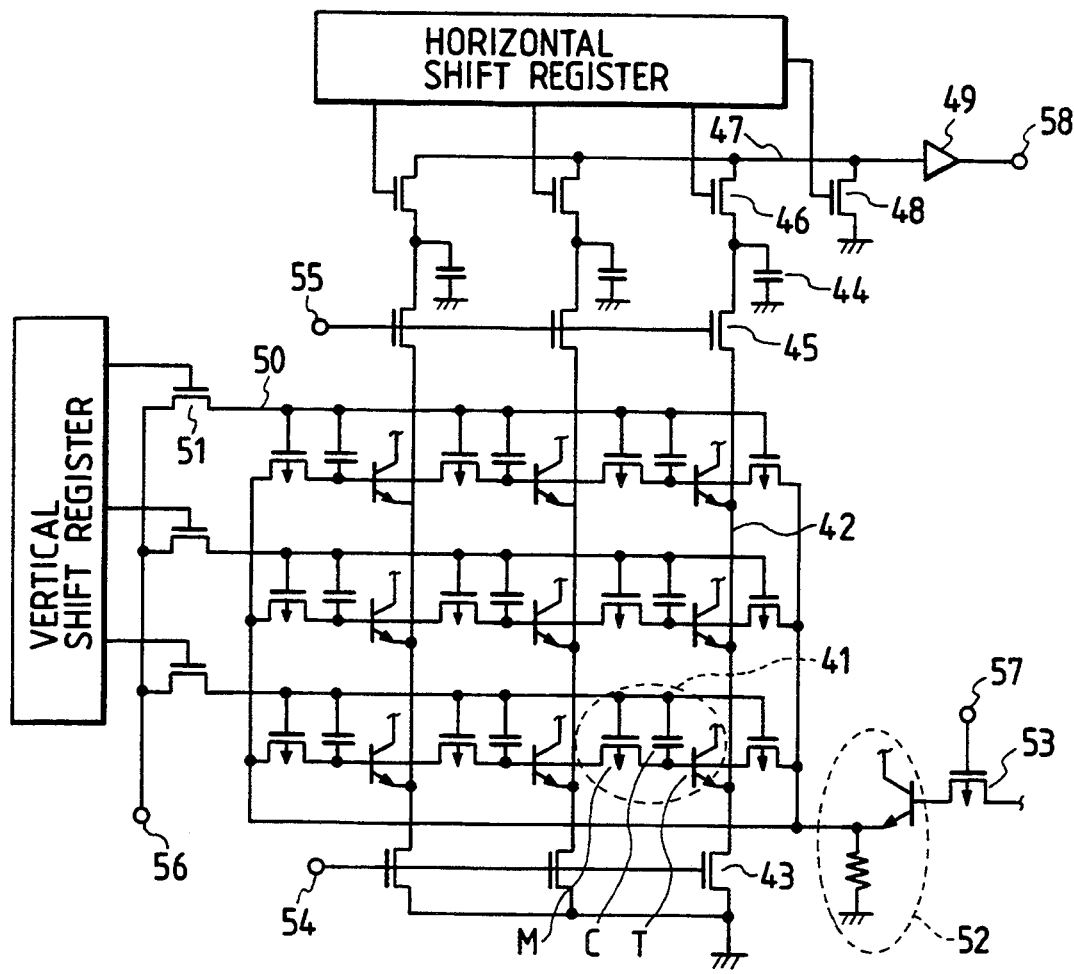
FIG. 30 is an equivalent circuit diagram of a two-dimensional photoelectric conversion device having pixels of FIG. 27 arranged in a two-dimensional array.

FIGS. 26A and 26B are views for explaining the operation of a device of FIGS. 25A and 25B showing a circuit and a pulse timing, respectively.

First, the reset operation takes place by applying a negative pulse to terminals $\phi_{BRS}$, $\phi_T$, and a positive pulse to a terminal $\phi_{TT}$, so that a first reset is effected. At this time, the anode of each photodiode and the base of bipolar transistor are held at a reset reference voltage $V_{BB}$. Then, a positive pulse is applied to a terminal $\phi_{ERS}$ so that the emitter of bipolar transistor and capacitor $C_T$ are reset at a reset reference voltage $V_{EE}$. Thus, the bipolar transistor is forward-biased in the base-emitter so that carriers are reset. Then, it is desirable to cause pulse $\phi_{ERS}$ to fall after rising of pulse $\phi_T$ to suppress any fixed pattern noise as tt.

If the reset operation is thus terminated, the storing operation is entered. At this time, transistors MR, $MT_1$ ... $MT_3$, $M_1$ ... $M_3$, $MV_1$ ... $MV_3$, $MH_1$ ... $MH_3$ are all in the off state.

Then, entering the reading operation, the MOS transistors $MT_1$ ... $MT_3$ are turned on by a pulse $\phi_T$, so that carriers are transferred concurrently to the bases of bipolar transistors $Q_1 \ldots Q_3$. Then, if the transistors $M_1 \ldots M_3$ are turned on by a pulse $\phi_{TT}$, the emitter is connected to a reading capacitor load $C_T$, so that a signal based on carriers stored in the base is read to the capacitor load $C_T$. Thereafter, the operation of a shift register causes three signals in time series to be output through an amplifier Amp.

Of course, it goes without saying that the pixels arranged in two-dimensional array can constitute an area sensor.

Embodiment 1

The embodiments of the present invention will be described below with reference to the drawings.

Figure 1:
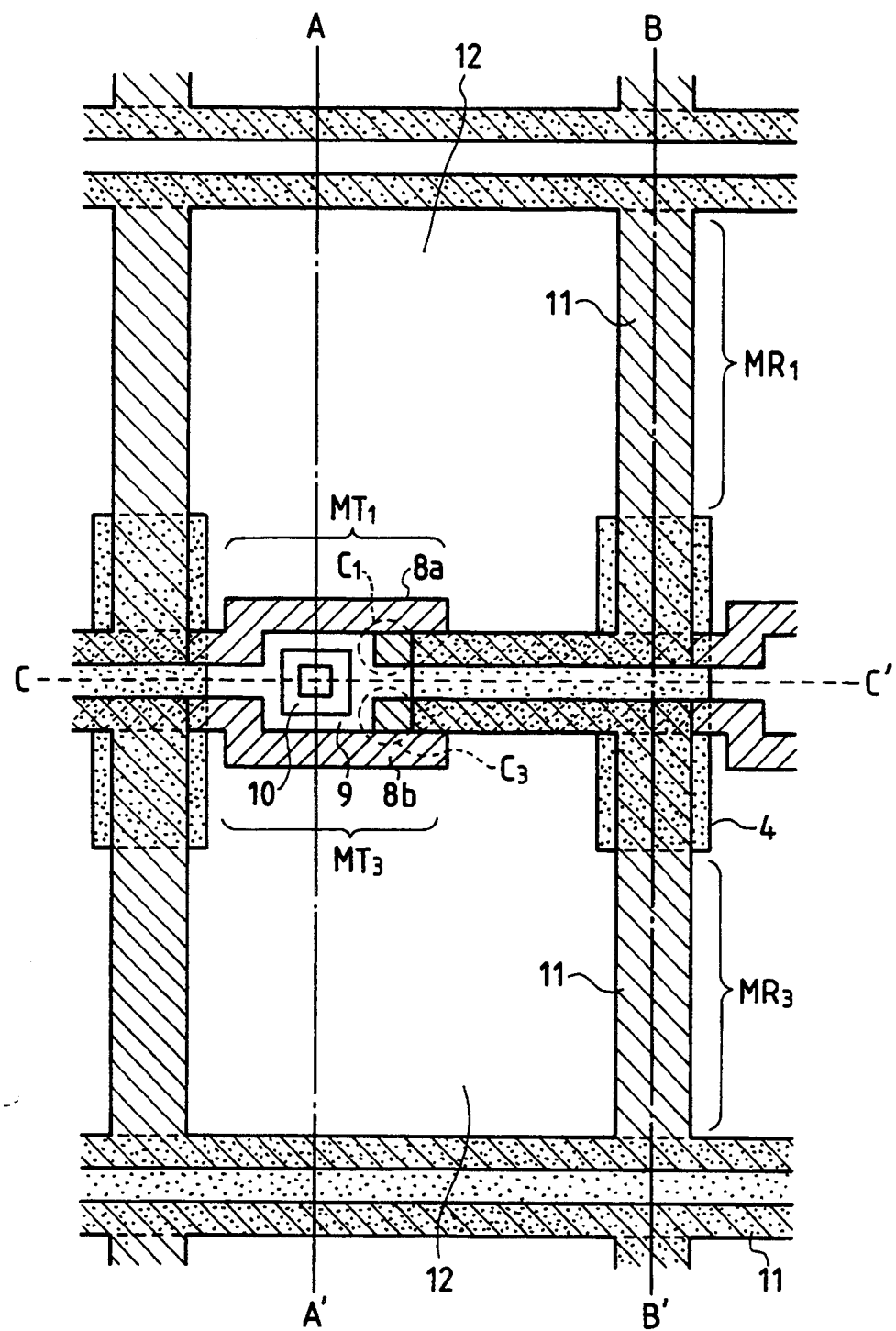
FIG. 1 is a plan view for two pixels (one photoelectric conversion cell) according to an embodiment of a photoelectric conversion device of the present invention.
Figure 2:
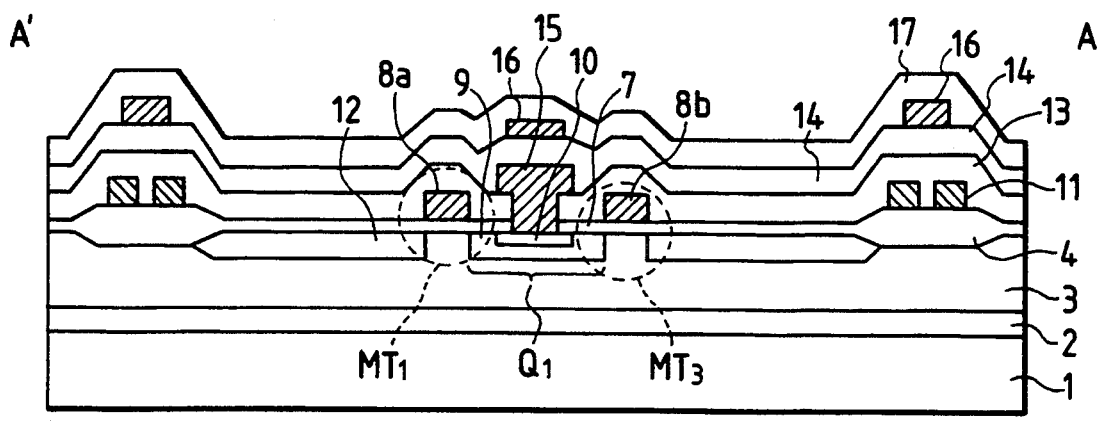
FIG. 2 is a cross-sectional view of FIG. 1 taken along the line A-A'.
Figure 3:
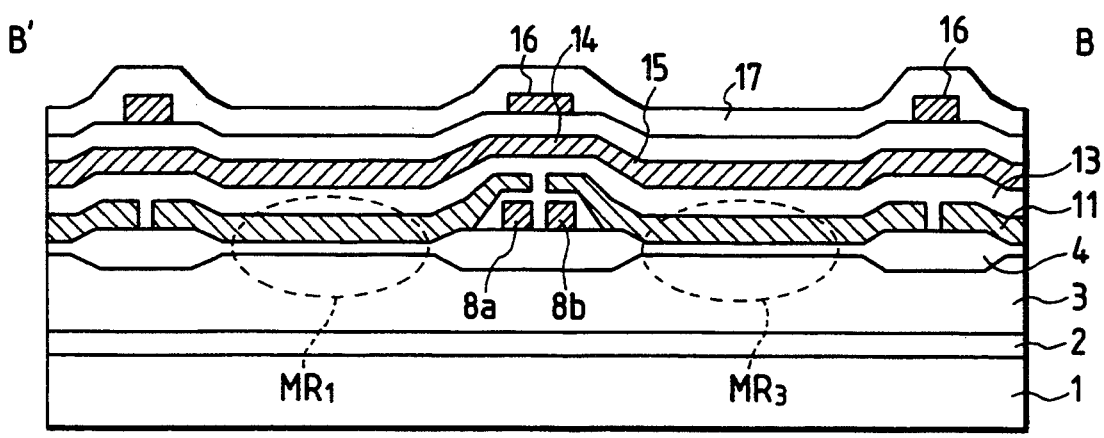
FIG. 3 is a cross-sectional view of FIG. 1 taken along the line B-B'.
Figure 4:
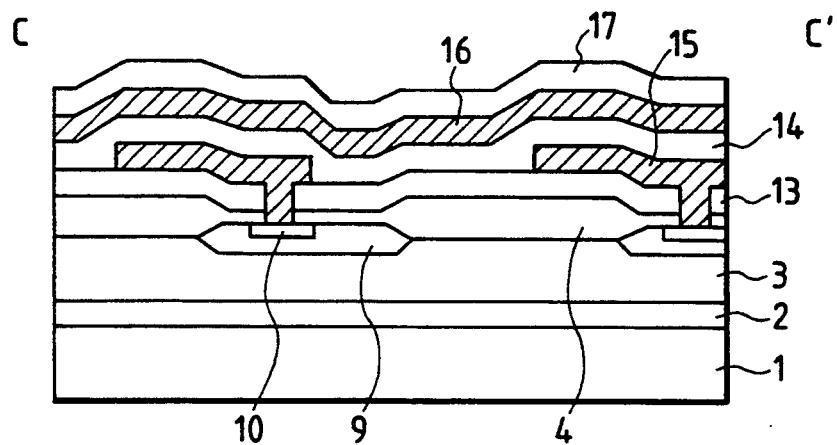
FIG. 4 is a cross-sectional view of FIG. 1 taken along the line C-C'.
Figure 5:
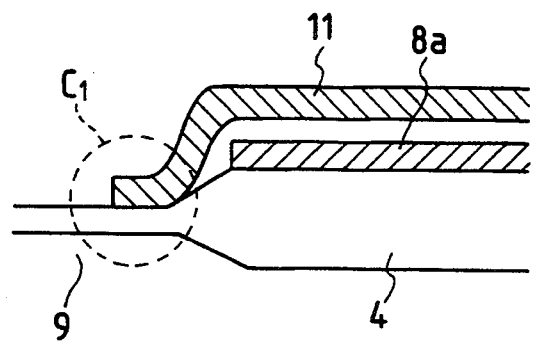
FIG. 5 is a cross-sectional view of a capacitor portion $C_1$ and its neighborhood of FIG. 1.
Figure 6:
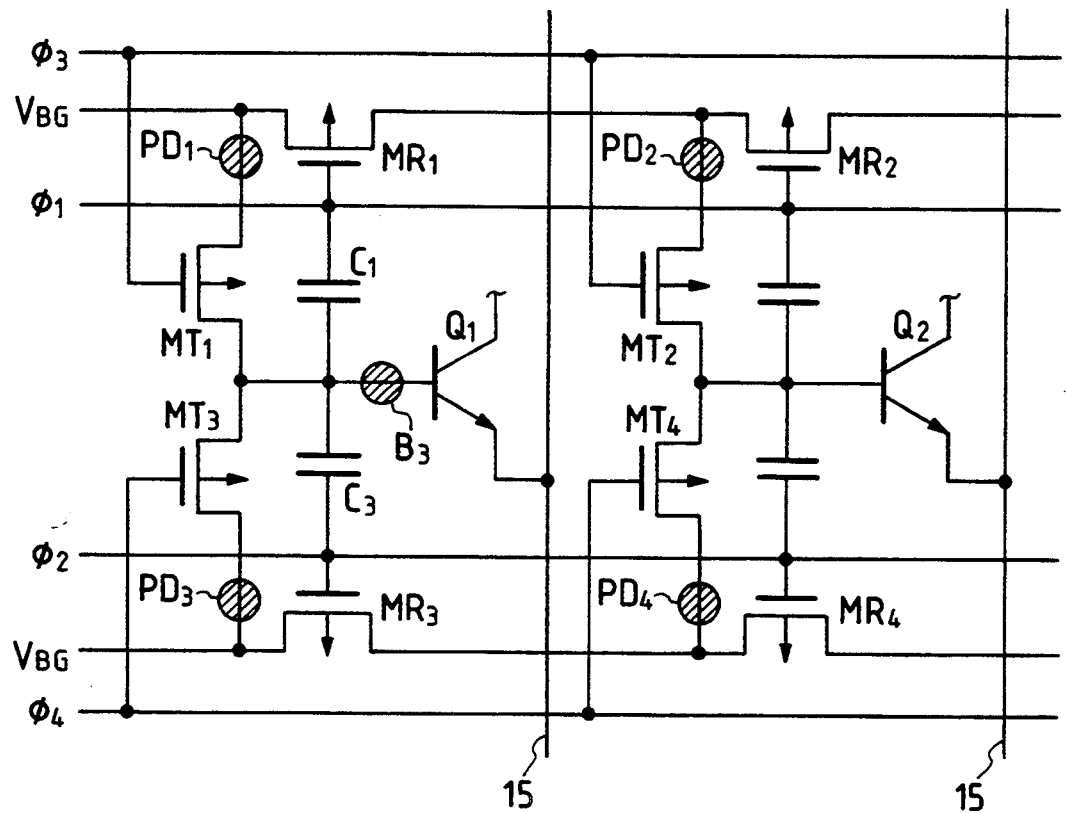
FIG. 6 is an equivalent circuit diagram for four pixels in this embodiment.

FIG. 1 is a plan view for two pixels (two photoelectric conversion cells) in an embodiment of a photoelectric conversion device according to the present invention, FIG. 2 is a cross-sectional view of FIG. 1 taken along the line A-A', FIG. 3 is a cross-sectional view of FIG. 1 taken along the line B-B', FIG. 4 is a cross-sectional view of FIG. 1 taken along the line C-C', and FIG. 5 is a cross-sectional view of a capacitor portion $C_1$ and its neighborhood of FIG. 1. FIG. 6 is an equivalent circuit diagram for four pixels. Note that in FIG. 1, the wirings and the insulation layer are omitted for easy understanding.

A photoelectric conversion device in this embodiment has two second transistors MT1, MT3 (insulated gate transistor, shown in FIGS. 1 and 2) provided corresponding to two carrier storage regions PD1, PD3, as shown in FIG. 6, wherein carriers are stored in the carrier storage regions PD1, PD3 through MOS transistors MT1, MT3 and sequentially transferred to a base region (control electrode region) $B_3$ of one bipolar transistor $Q_1$. By controlling the voltage of the base region $B_3$ via capacitors $C_1$, $C_3$, a signal based on carriers transferred to the base region $B_3$ is output from an emitter region (first main electrode region) 10 via a wiring 15. Residual charges in the carrier storage regions PD1, PD3 are discharged by turning on two third transistors MR1, MR3 (insulated gate transistors), respectively, which are set at a predetermined voltage $V_{BG}$. When the MOS transistors MR1, MR3 are off, the carrier storage regions PD1, PD3 are electrically isolated from each other.

In FIGS. 1 to 5, 1 is an n-type semiconductor substrate, 2 is an n-type diffusion layer, 3 is an n-type epitaxial layer, 4 is a field oxide film which is an element separation region, 7 is a gate oxide film, 8a, 8b are poly-side films which act as the gate electrodes of MOS transistors MT1, MT3, 9 is a p-type region acting as the base region of a bipolar transistor $Q_1$, as well as the source regions (or drain regions) of MOS transistors MT1, MT3, 10 is an n-type region which is an emitter region of the bipolar transistor $Q_1$, and 11 is an electrode acting as the gate electrode of MOS transistors MR1, MR3, as well as constituting the capacitors $C_1$, $C_3$, as shown in FIG. 5. Also, 12 is a p-type region constituting the carrier storage regions PD1, PD3, 13 is a layer insulation film (BPSG film), 14 is a layer insulation film (PSG film), 15 is a first AL layer, 16 is a second AL layer, and 17 is a passivation film.

Figure 7:
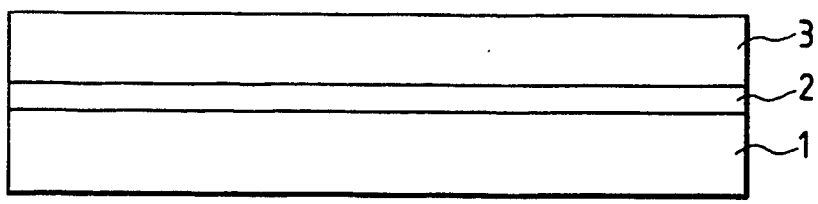
FIG. 7 is a cross-sectional view showing a fabrication method of a photoelectric conversion device in this embodiment.
Figure 8:
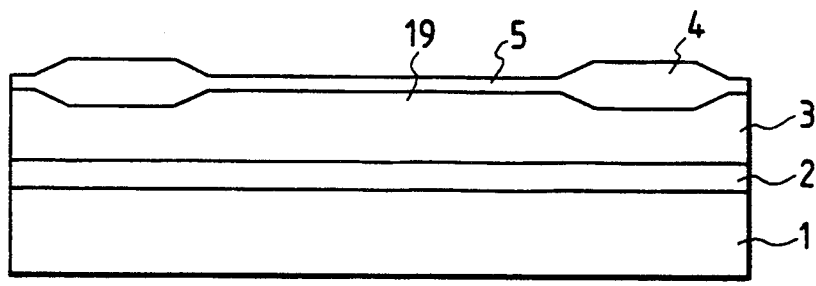
FIG. 8 is a cross-sectional view showing a fabrication method of a photoelectric conversion device in this embodiment.
Figure 9:
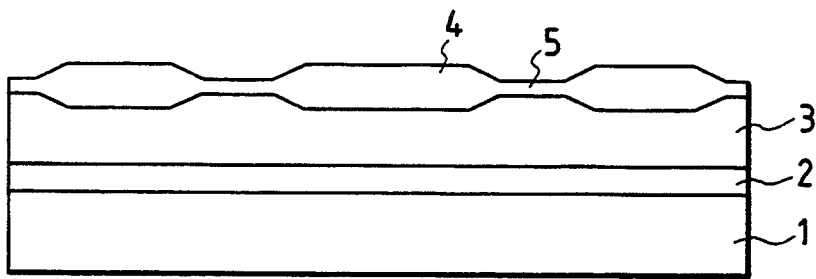
FIG. 9 is a cross-sectional view showing a fabrication method of a photoelectric conversion device in this embodiment.
Figure 10:
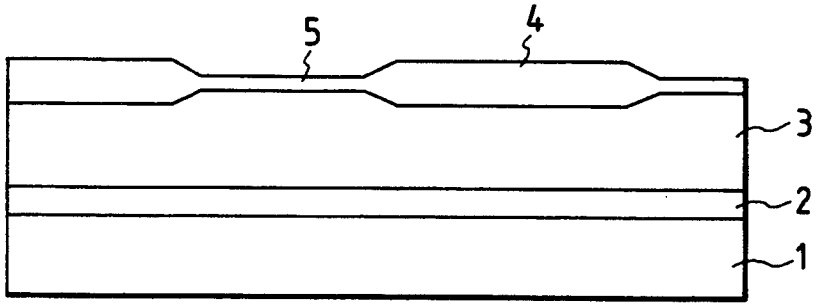
FIG. 10 is a cross-sectional view showing a fabrication method of a photoelectric conversion device in this embodiment,.
Figure 11:
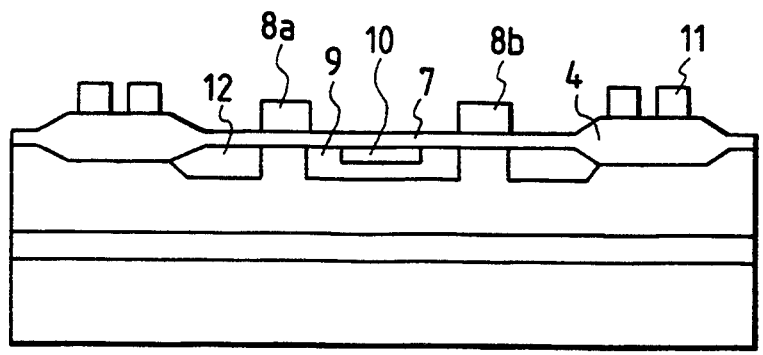
FIG. 11 is a cross-sectional view showing a fabrication method of a photoelectric conversion device in this embodiment.
Figure 12:
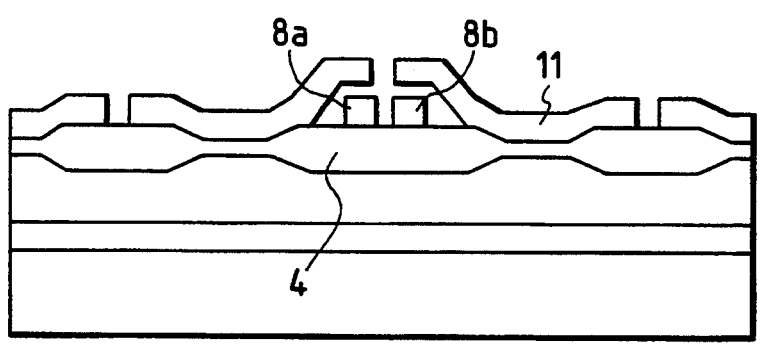
FIG. 12 is a cross-sectional view showing a fabrication method of a photoelectric conversion device in this embodiment.
Figure 13:
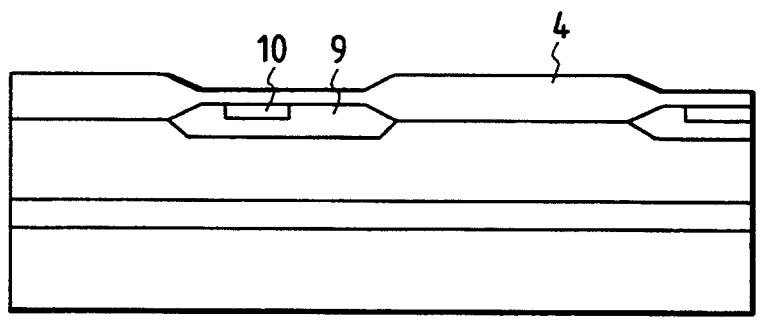
FIG. 13 is a cross-sectional view showing a fabrication method of a photoelectric conversion device in this embodiment.
Figure 14:
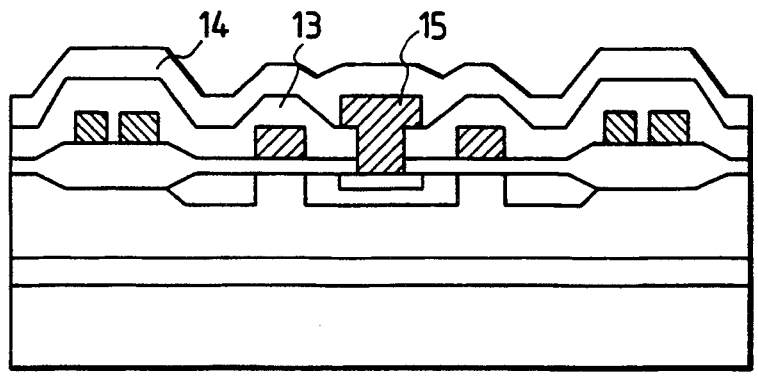
FIG. 14 is a cross-sectional view showing a fabrication method of a photoelectric conversion device in this embodiment.

A fabrication method of a photoelectric conversion cell with the above construction will be described below using FIGS. 7 to 17. Note that FIG. 8, FIG. 11 and FIG. 14 are views corresponding to an A-A' cross section of FIG. 1, FIG. 9, FIG. 12 and FIG. 15 are views corresponding to a B-B' cross section of FIG. 1, and FIG. 10, FIG. 13 and FIG. 16 are views corresponding to a C-C' cross section of FIG. 1. Herein, in FIG. 8, FIG. 9, FIG. 11, FIG. 12, FIG. 14 and FIG. 15, an element area 19 is shown in reduced scale for the simplification.

The n-type semiconductor substrate 1 utilized has a specific resistance of 0.01 $\Omega$cm to 10 $\Omega$cm. First, an n-type diffusion layer 2 is formed thereon by introducing As impurities 0.1 to 1 $\mu$m deep, with a surface density of 1E17 to 1E20/cm$^3$ by ion implantation or thermal diffusion. Then, using epitaxial growth method, an n-type epitaxial layer 3 is formed, with a growth layer density of 5E13 to 5E15/cm$^3$ about 3 to 15 $\mu$m deep (FIG. 7)

Then, using selective oxidation method, an element forming region 19 and a field oxide film 4 which is an element separation region are formed. At this time, a pad oxide film 5 is made 100 to 500 angstroms thick, a nitride film by low pressure CVD is made 1000 to 3000 angstroms thick, and a field oxide film 4 is made 4000 to 10000 angstroms thick (FIGS. 8 to 10).

It is needless to say that when well diffusion is required to form a peripheral drive circuit from CMOS transistors, or an n-type diffusion layer of high density is required, these processes must be completed before LOCOS method.

Then, after the pad oxide film 5 is removed and an element forming region is exposed by etching, oxidation of approximately 1000 to 3000 angstroms is effected, then this oxide film is removed again, and a new gate oxide film 7 is formed approximately 100 to 500 angstroms thick by dry oxidation. Subsequently, a polysilicon film is formed approximately 2000 to 4000 angstroms thick by low pressure CVD method, and a W film is formed approximately 1000 to 2000 angstroms thick by low pressure CVD or sputtering, these laminated films being transformed into poly-side by thermal treatment.

Subsequently, photoetching is conducted to leave poly-side films 8a, 8b at only desired portions, and an oxide film is grown approximately 100 to 1000 angstroms thick on the poly-side by thermal oxidation. Then, a polysilicon film is formed approximately 2000 to 4000 angstroms thick by low pressure CVD, this polysilicon film becoming an electrode 11 having both features of the pixel-to-pixel separation in the horizontal direction and the voltage control of control electrode, and a gate electrode for the peripheral circuit, formed from CMOS transistors. Also, when poly-side formation is needed, W film is subsequently formed approximately 1000 to 2000 angstroms thick by low pressure CVD or sputtering, and subjected to thermal oxidation for poly-side formation, and photoetching is conducted to remove other than desired portions. At this stage, a p-type region 12 as carrier storage region and a p-type region 9 as base region are formed concurrently from field oxide film and poly-side film in self-aligned manner, using ion implantation method and thermal diffusion method. The conditions used this time were such that boron ions of 1E12 to 4E12/cm$^2$ were implanted at 40 keV, and thermal treatment was conducted for 1 to 3 hours in the inert gas atmosphere at 1100° C. Subsequently, when NMOS transistor exists in the emitter region 10 and the peripheral circuit, the source and drain regions of NMOS transistor are formed concurrently by photolithography process and ion implantation method. In this embodiment, As ions of about 1E15 to 1E16/cm are implanted at 100 keV (FIGS. 11 to 13).

Also, the formation of PMOS transistor in forming the peripheral circuit form CMOS transistors, as well as the formation of high density layer for ohmic contact to the p-type diffusion layer are subsequently conducted by ion implantation.

Figure 15:
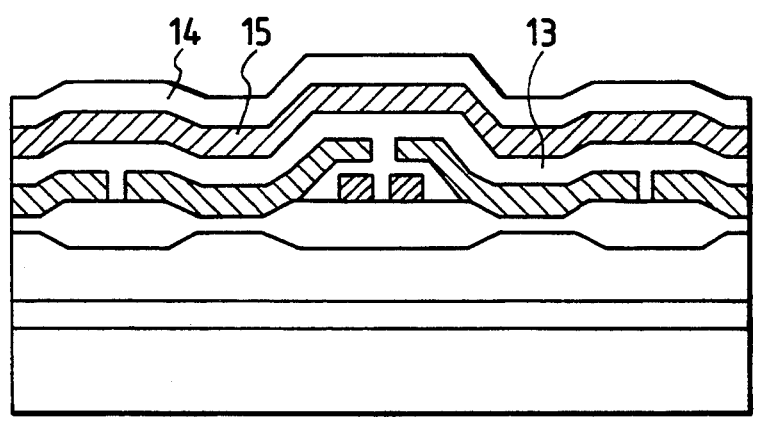
FIG. 15 is a cross-sectional view showing a fabrication method of a photoelectric conversion device in this embodiment.
Figure 16:
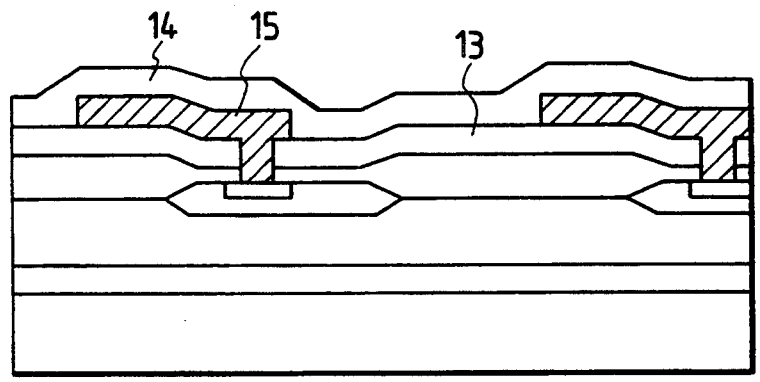
FIG. 16 is a cross-sectional view showing a fabrication method of a photoelectric conversion device in this embodiment.
Figure 17:
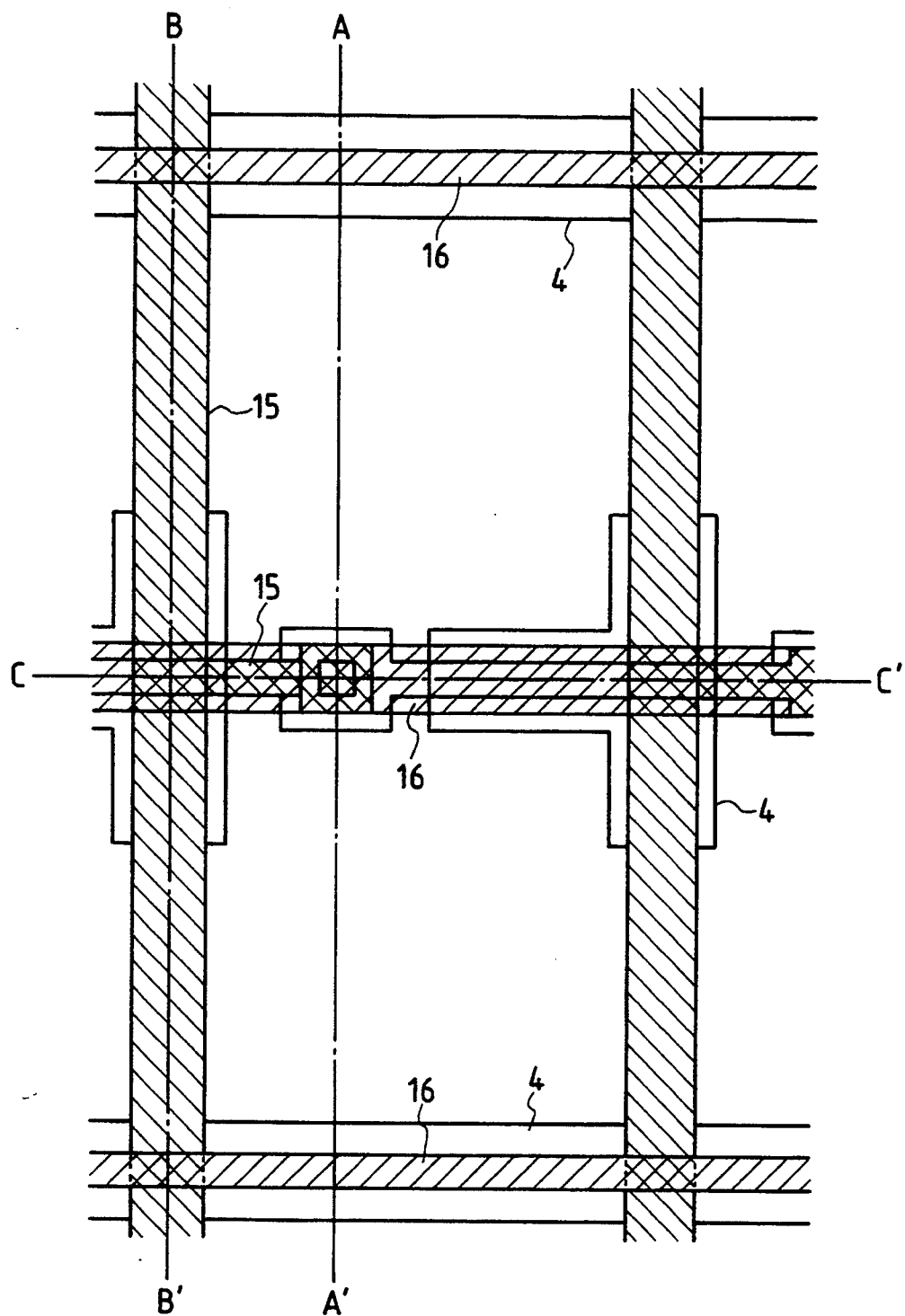
FIG. 17 is a plan view showing a fabrication method of a photoelectric conversion device in this embodiment.

CVD film 13 for insulation between the wirings is formed approximately 5000 to 9000 angstroms thick by atmospheric pressure CVD. This process typically uses a BPSG film favorable in the subsequent wiring forming process, and therefore the BPSG film has been adopted. Subsequently, reflow process is conducted for the flattening and the activation of ions implanted in the previous process. Further, contact holes are formed by photoetching, Al—Si film is formed approximately 6000 to 10000 angstroms thick by sputtering, and a wiring pattern 15 is formed by photoetching. After undergoing the alloy process, PSG film 14 is formed approximately 6000 to 10000 angstroms thick by atmospheric pressure CVD (FIGS. 14 to 16).

Through holes are opened by photoetching again to allow the connection of Al—Si between the second layer and the first layer to be made at a desired portion, Al—Si 16 of the second layer is formed approximately 8000 to 12000 angstroms thick by sputtering, with unnecessary portion for Al—Si of the second layer removed by photoetching, the alloy process is then conducted, a plasma nitride film 17 which is a passivation film is formed approximately 6000 to 12000 angstroms thick by plasma CVD, and bonding pads are bored by photoetching, so that the product is completed (FIGS. 2 to 4, FIG. 17).

Figure 18:
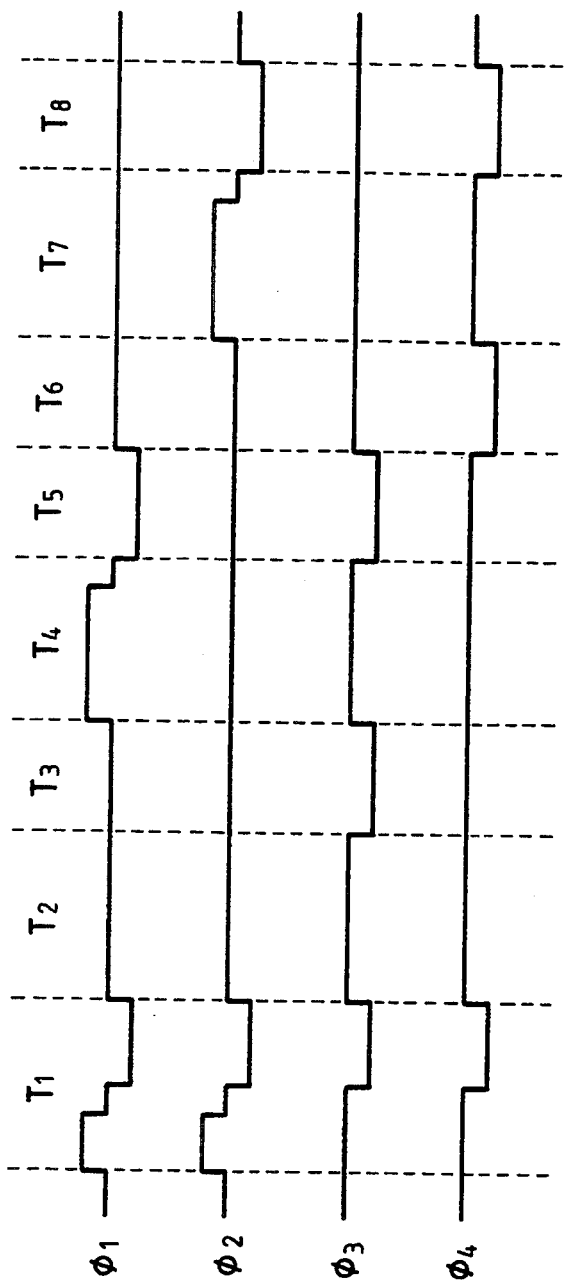
FIG. 18 is a timing chart showing the operation of a photoelectric conversion device in this embodiment.

The operation of the photoelectric conversion device will be described below with reference to an equivalent circuit of FIG. 6 and a timing chart of FIG. 18.

First, the first reset operation for initializing all the pixels is effected (T1). With $\phi_1$, $\phi_2$ at high level, the base region $B_3$ is forward-biased with respect to the emitter region via capacitors $C_1$, $C_3$, whereby carriers are discharged. Thereafter if $\phi_1$, $\phi_2$ are set at low level, and $\phi_3$, $\phi_4$ are set at low level, the MOS transistors of photoelectric conversion cell are turned on, so that the voltage for all the pixels is rendered constant ($V_{BG}$).

Then, the storage operation for storing light generated carriers is performed (T2). At this time, the MOS transistors $MR_1$, $MR_3$, $MT_1$, $MT_3$, $MR_2$, $MR_4$, $MT_2$, $MT_4$ have been all turned off, and light generated carriers are stored in carrier storage regions PD1, PD3, (PD2, PD4). For the simplicity, two pixels on the left side of the figure will be explained, but two pixels on the right side operate exactly in the same way.

Then, with $\phi_3$ set at low level, carriers generated in the carrier storage region PD1 are transferred through the MOS transistor MT1 to the base region $B_3$ (T3). Then, carriers transferred are read at a reading pulse $\phi_1$ (T4). At this time, the MOS transistor MR1 is naturally off, and the voltage of the base region $B_3$ is forward-biased with respect to the emitter region only with an overlap capacitor $C_1$ between the base region and the electrode, whereby the transistor operation of bipolar transistor $Q_1$ takes place.

Subsequently, with $\phi_1$, $\phi_3$ at low level, the MOS transistors MR1, MT1 are turned on, and the reset operation for carriers generated in the carrier storage region PD1 is effected (T5). Thereby, the base region $B_3$ is set at an initial voltage again. Then, carriers generated in the carrier storage region PD2 are transferred, read, and reset at T6 to T8 in the same way, whereby a series of operations is completed and the operation returns back to T1.

While in the embodiment as described above, the capacitors $C_1$, $C_2$ for controlling the voltage of the base region are provided, it should be noted that the present invention can also be used without provision of such capacitors.

As above described, in this embodiment, the opening ratio is raised and the sensitivity is improved by selectively connecting a plurality of photodiodes as the photoelectric converter in sequence with one bipolar transistor for amplification.

Embodiment 2

Figure 19:
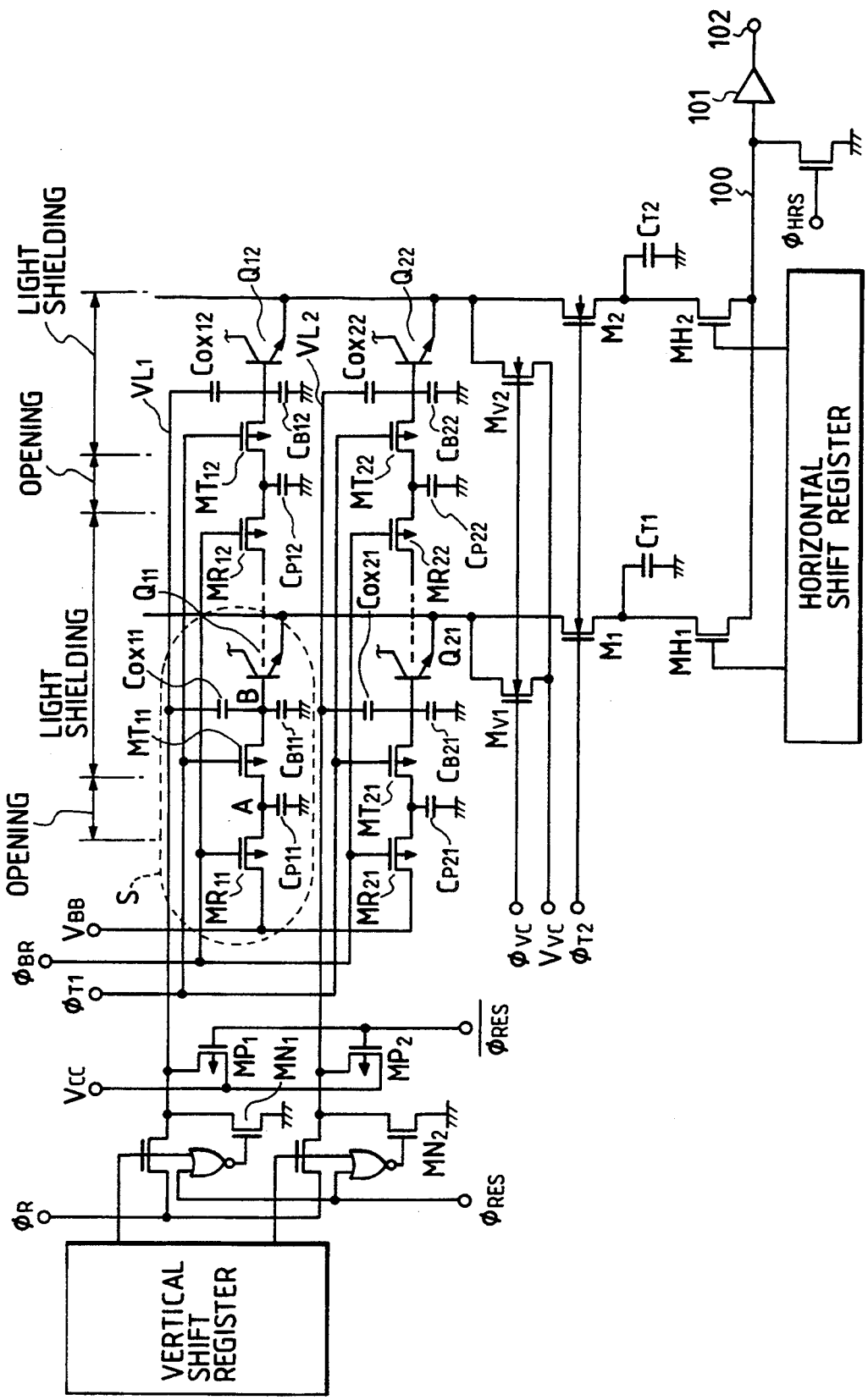
FIG. 19 is an equivalent circuit diagram showing the configuration of a first embodiment of a photoelectric conversion device according to the third invention.

FIG. 19 is an equivalent circuit diagram showing a second embodiment of a photoelectric conversion device according to the present invention.

This embodiment will be described with an instance of a total of four pixels consisting of two pixels in the vertical direction and two pixels in the horizontal direction.

As shown in the same figure, each pixel S (region as encircled by the broken line in the figure) is constituted of reset switch transistor MR11 to MR22 which is second switch means, transfer transistor MT11 to MT22 which is first switch means, signal reading transistor Q11 to Q22, and light charge storage capacitor $C_p11$ to $C_p22$, signal holding capacitor $C_B11$ to $C_B22$, and control capacitor $C_{ox}11$ to $C_{ox}22$ each of which is light signal storing means for a photodiode. In particular, the portions of light charge storage capacitors $C_p11$ to $C_p22$ are illuminated by light from the above, and the other portions are light-shielded to prevent light from penetrating therethrough. Note that the signal holding capacitors $C_B11$ to $C_B22$ and the control capacitors $C_{ox}11$ to $C_{ox}22$ constitute light signal holding means, wherein the signal holding capacitors $C_B11$ to $C_B22$ are base capacitors for signal reading transistors Q11 to Q22.

Figure 20:
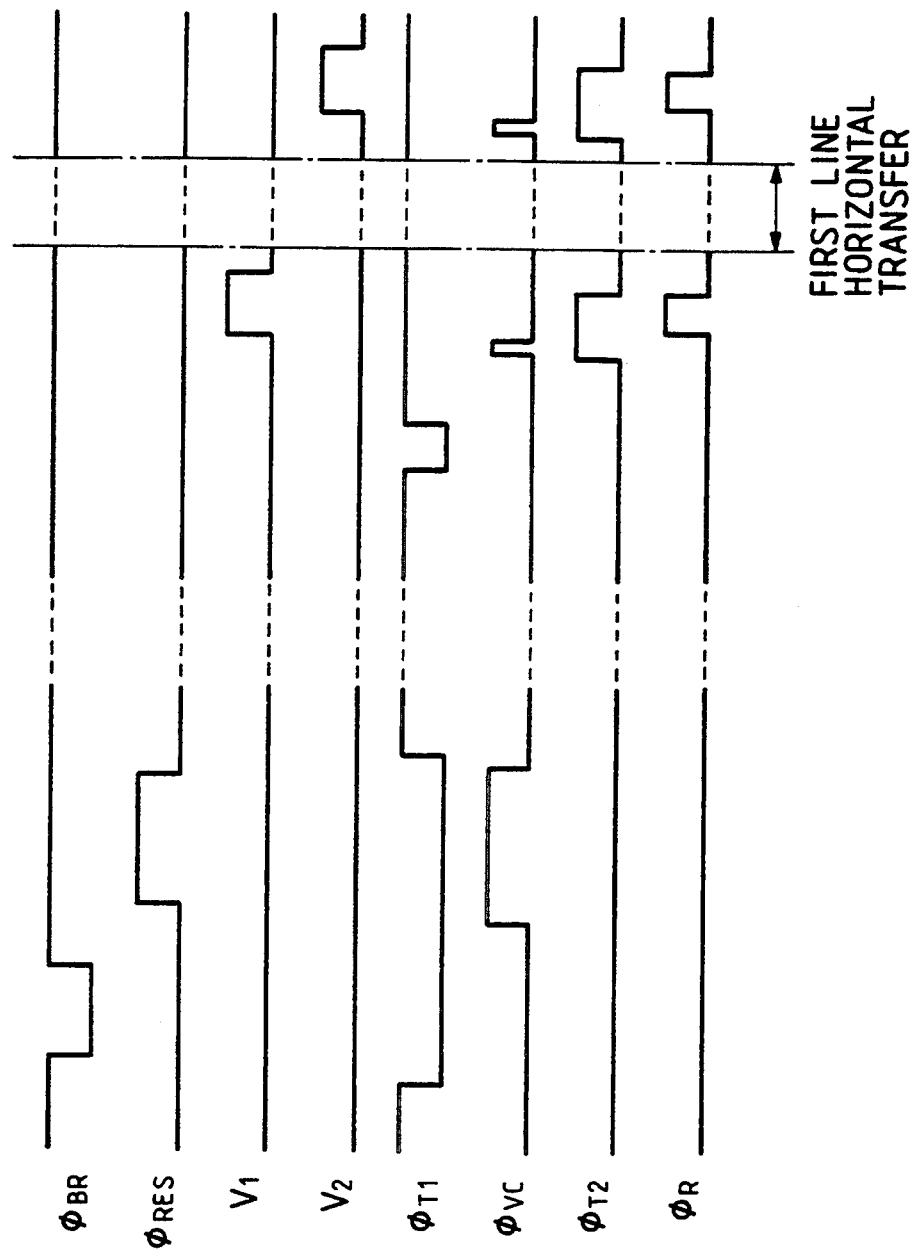
FIG. 20 is a timing chart showing the operation of a photoelectric conversion device in the first embodiment.

The operation of the photoelectric conversion device in this embodiment will be described below with reference to a timing chart of FIG. 20.

First, with the pulse $\phi_{Tl}$ set at low level, the PMOS transistors MT11 to MT22 are turned on, so that the light charge storage capacitors $C_p11$ to $C_p22$ and the signal holding capacitors $C_B11$ to $C_B22$ are set at the same voltage. Note that the common wiring via which pulse $\phi_{Tl}$ is applied to PMOS transistors MT11 to MT22 and pulse generating means (not shown) for $\phi_{Tl}$ constitute first control means.

Then, if the pulse of $\phi_{BR}$ is set at low level with the pulse $\phi_{Tl}$ left at low level (at this time, $V_{BB}$ is set at a higher level than the low level pulse a threshold voltage of PMOS transistor), the PMOS transistors MT11 to MT22 and the MR11 to MR22 are turned on, so that the light charge storage capacitor $C_p11$ to $C_p22$ and the signal holding capacitor $C_B11$ to $C_B22$ for each pixel are reset to the initial voltage (first reset). Note that the common wiring via which pulse $\phi_{BR}$ is applied to PMOS transistors MR11 to MR22 and pulse generating means (not shown) for $\phi_{BR}$ constitute second control means.

Then, with the pulse $\phi_{VC}$ set at high level, the NMOS transistors MV1, MV2 Are turned on, and the emitter voltage of each pixel is set at $V_{VC}$. In this state, the MOS transistors MP1, MP2 are turned on by a pulse number 2 as described below, and the horizontal drive lines VL1, VL2 are set at high level (voltage $V_{CC}$), the voltage in the base region of signal reading transistors Q11 to Q22 being elevated via the control capacitors $C_{OX}11$ to $C_{OX}22$ to forward-bias the base-emitter and discharge residual charges, so that the reset operation is effected concurrently for all the pixels. Thereafter, the MOS transistors MN1, MN2 are turned on by $\phi_{RES}$, and the horizontal drive lines VL1, VL2 are caused to fall to low level (GND) at the same time, whereby the potential for the light charge storage capacitor $C_p11$ to $C_p22$ and the signal holding capacitor $C_B11$ to $C_B22$ for each pixel is made constant and biased in the reverse direction (second reset). Note that an NOR circuit, a pulse $\phi_{RES}$, pulse generating means (not shown), MOS transistors MN1, MN2, and MOS transistors MP1, MP2 constitute the third control means.

After the second reset is completed, a high pulse is applied to $\phi_{T1}$ to turn off the PMOS transistors MT11 to MT22, the storage operation of light carriers is started concurrently for all the pixels in the photodiodes as represented by the light charge storage capacitors $C_p11$ to $C_p22$.

Then, after the storage operation, with the pulse $\phi_{T1}$ at low level for a certain period, carriers of the light charge storage capacitors $C_p11$ to $C_p22$ are transferred to the signal holding capacitors $C_B11$ to $C_B22$.

The transfer efficiency at this time can be expressed by $$\frac{C_{pmn}}{C_{pmn} + C_{Bmn} + C_{oxmn}}$$

(where m, n is equal to 1 or 2)

Thereafter, the pulse $\phi_R$ is selected by the NMOS transistor, to which the output of vertical shift register is applied, and then applied to the horizontal drive lines VL1, VL2, whereby a signal is read into the capacitors $C_{T1}$, $C_{T2}$ through the MOS transistors M1, M2 to be controlled by the pulse $\phi_{T2}$.

The signal read into the capacitors $C_{T1}$, $C_{T2}$ is transferred to a horizontal output line 100 through the transfer MOS transistors MH1, MH2 to be selected by the horizontal shift register, and output through an output amplifier 101 from an output terminal 102. Note that the reset of the horizontal output line 100 is effected by setting the pulse $\phi_{HRS}$ to high level.

As described above, in this embodiment, the storage operation is performed concurrently for all the pixels, and ended at the same time.

Since in this embodiment, when the number of pixels is increased, $R_{ON}$ (on resistance) can be reduced by increasing the dimension corresponding to the NMOS transistors to which the output of vertical shift register is applied, there is no increase in the occupied area of third control means such as NOR circuit, even if the pixel pitch in the vertical direction is narrower or the number of pixels in the horizontal direction is increased.

Embodiment 3

While in the second embodiment the PMOS transistors MT11 to MT22 are turned off by the rising of pulse $\phi_{T1}$ after the second reset is ended, and immediately the storage operation for all the pixels is started, it is possible with no problem that the PMOS transistors MT11 to MT22 are left on during the storage operation, the transfer operation along with the storage operation is performed (i.e., carriers generated by the light charge storage capacitors $C_p11$ to $C_p22$ are instantaneously transferred to the signal holding capacitors $C_B11$ to $C_B22$), and after the storage (transfer) operation, the PMOS transistors MT11 to MT22 are turned off by applying a pulse $\phi_{T1}$, Then, the transfer efficiency from the light charge storage capacitors $C_p11$ to $C_p22$ to the signal holding capacitors $C_B11$ to $C_B22$ may be equal to 1.

Embodiment 4

In the second embodiment the third control means is constituted of an NOR circuit, pulse $\phi_{RES}$, pulse generating means of pulse number 2 (not shown), MOS transistors MN1, MN2, and MOS transistors MP1, MP2, and the output signal of the vertical shift register is input to NMOS transistors and the NOR circuit, but
1 No pulse $\phi_R$ is applied to the horizontal drive lines VL1, VL2 unless the output of vertical shift register is higher than the high level plus Vth (threshold level) of NMOS transistor.
2 When the micro structure of device is progressed, the reduction in the number of elements for the third control means is desired.

Figure 21:
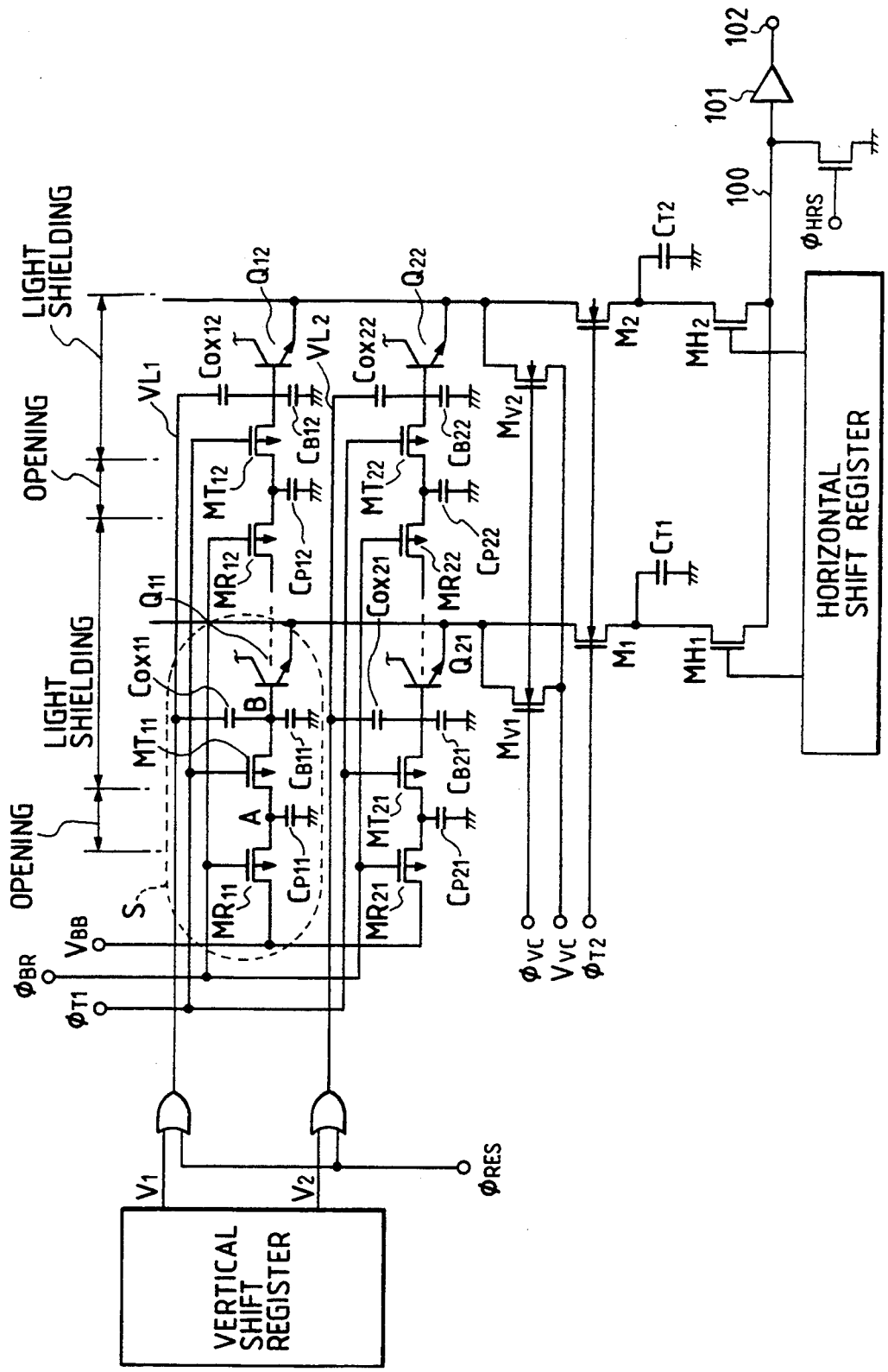
FIG. 21 is an equivalent circuit diagram showing the configuration of a second embodiment of a photoelectric conversion device according to the third invention.

In this fourth embodiment, the output signal of vertical shift register and the pulse $\phi_{RES}$ are input to an OR circuit, as shown in FIG. 21, which is connected to the horizontal drive lines VL1, VL2. With such a configuration, at the second reset, the pulse $\phi_{RES}$ is set at high level, the horizontal drive lines VL1, VL2 are caused to rise to high level concurrently, the pulse $\phi_{RES}$ is set at low level, and then the horizontal drive lines VL1, VL2 are set at low level.

Figure 22:
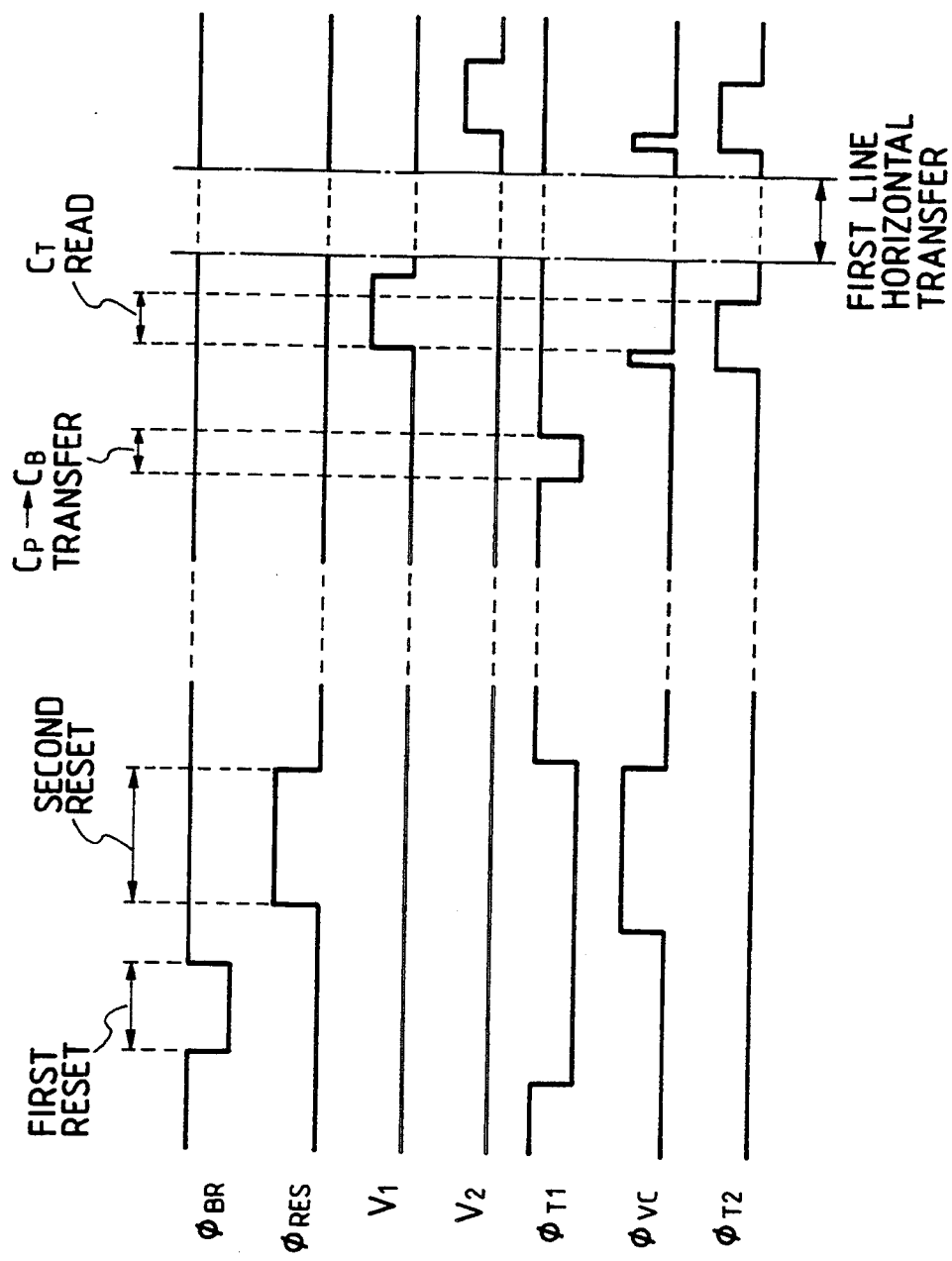
FIG. 22 is a timing chart showing the operation of a photoelectric conversion device in the second embodiment.

In the reading operation, read pulses V1, V2 are applied to the horizontal drive lines VL1, VL2 for each row selected by the output of the vertical shift register. The drive pulse in this embodiment is as shown in FIG. 22.

According to this embodiment, the third control means can be constituted only of an OR circuit, and pulse generating means (not shown) of pulse $\phi_{RES}$, and the high levels for all the pulses can be made equal.

Embodiment 5

In the fourth embodiment, for example, when strong light illuminates a pixel at the right upper portion in FIG. 21, the voltage of light charge storage capacitor $C_p12$ will rise, and if exceeding a certain voltage, holes may flow into adjacent signal holding capacitor $C_B11$ or $C_B12$ through PMOS transistor $MR_{12}$ or $MT_{12}$, thereby increasing the voltage. As a result, there may occur such a possible problem in that a pizel at the left upper portion which is not illuminated by light may output a spurious light signal.

Figure 23:
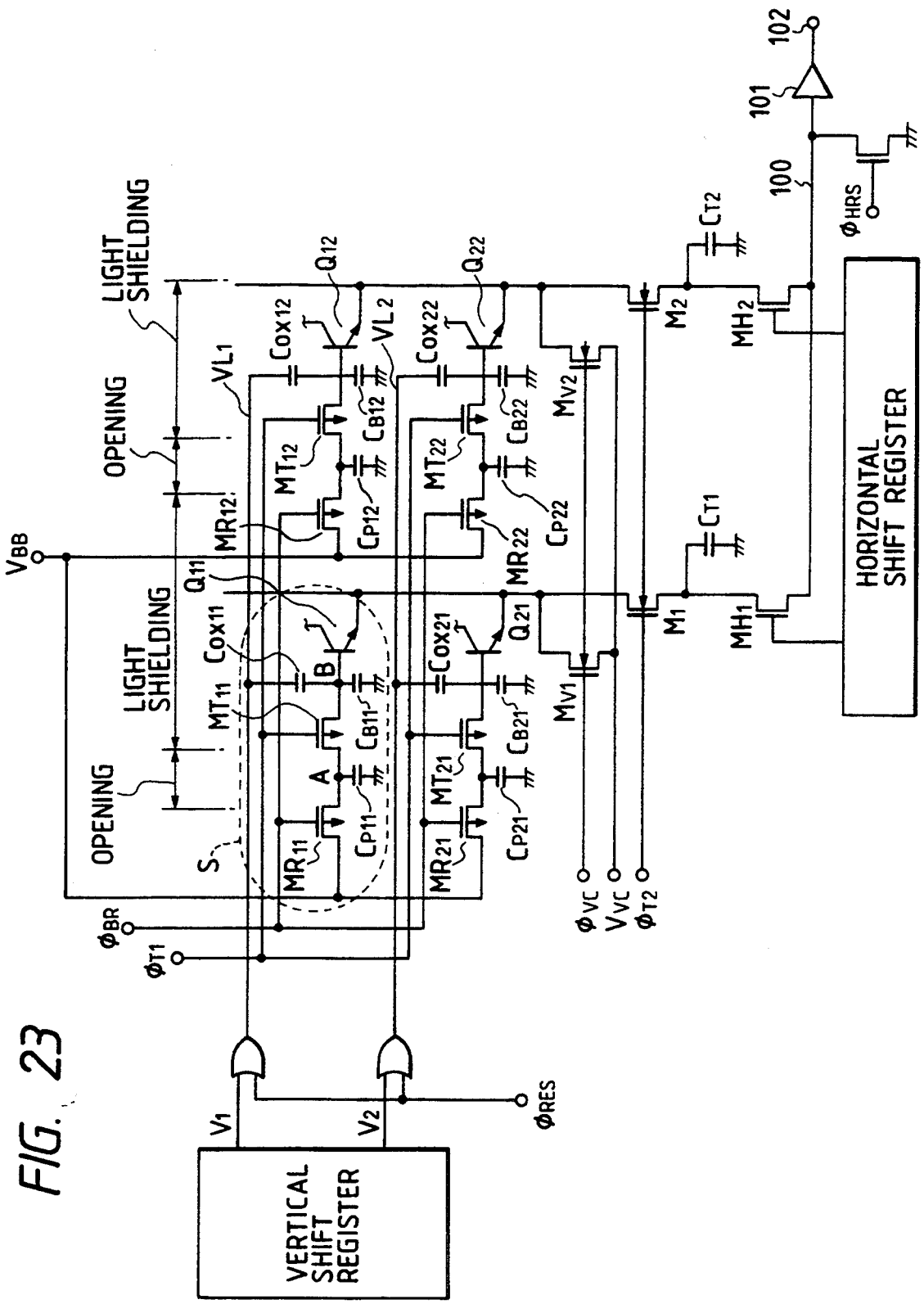
FIG. 23 is an equivalent circuit diagram showing the configuration according to a third embodiment of a photoelectric conversion device according to the third invention.

Therefore, in this embodiment, the source terminals of PMOS transistors MR11 to MR22 are led out by wiring from each pixel, as shown in FIG. 23, and further the high level of base reset pulse $\phi_{BR}$ is set at an appropriate value of $V_{CC}$ or less. As a result, even if strong light illuminates a pixel at the right upper portion, and the voltage of light charge storage capacitor $C_p12$ may rise, carriers passing through the PMOS transistor $MR_{12}$ will flow into voltage source $V_{BB}$, thereby preventing the occurrence of spurious signal between adjacent pixels. Note that the operation timing is exactly the same as in the third embodiment.

Figure 31:
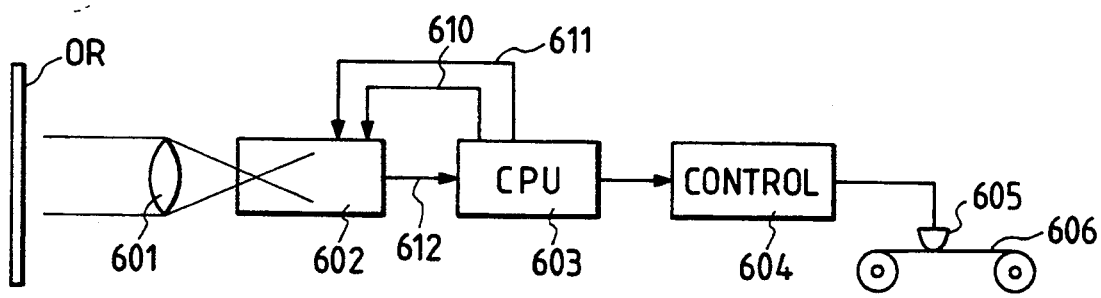
FIG. 31 is a block diagram of a signal processing system using a photoelectric conversion device of the present invention.

FIG. 31 is a block diagram showing the configuration of a signal processing system such as a communication system, a facsimile apparatus, or a video recorder, using a photoelectric conversion device of the present invention.

OR is an original carrying image information therein, 601 is an imaging lens, and 602 is a photoelectric conversion device of the present invention.

The photoelectric conversion device 602 may be a unitary device in a simple communication system, for example, a line sensor for the facsimile, and an area sensor for the video recorder.

603 is a control circuit containing a central processing unit, which is connected via an input line 612, an output line 610 and a voltage source supply line 611 to the device 602.

604 is a recording control circuit which is connected to a recording head 605 to write information into a recording medium 606.

The recording head 605 is a magnetic head in the case of video recorder, and a thermal head or an ink jet head in the case of facsimile.

And the recording head 605 is contained by a recording apparatus placed at another site via cable in the case of communication system.

As above described, according to the present invention, the number of main electrodes for the output of signal can be reduced to half that as conventionally used, without changing any conventional processes. As a result, the value of parasitic capacitor $C_{vl}$ for the signal line can be reduced to about 50 to 70% of the conventional one. The main electrode region conventionally existing in the central portion of one pixel moves to a separation portion of pixel, and the effective opening area can be increased about 20 to 30%.

Also, according to the present invention to operate a photoelectric conversion device having this structure, the sensitivity can be improved about 30 to 80% more than conventionally, as a result of the accumulated effects such as the reduction in the parasitic capacitor $C_{vl}$, and the increase in the effective opening area.

Also, according to the present invention, the start and termination of the storage operation can be made coincident for all the pixels, so that it is possible to prevent distortion of output image from occurring when picking up a fast motion picture.

What is claimed is:

1. A photoelectric conversion device comprising a photoelectric conversion cell, as an individual pixel, comprising:
    a first transistor having a control electrode region consisting of a semiconductor of one conduction type, and first and second main electrode regions consisting of a semiconductor of opposite conduction type of said one conduction type, for outputting a signal from said first main electrode region based on carriers transferred to said control electrode region;
    a carrier storage region provided adjacent said first transistor, consisting of a semiconductor of said one conduction type for storing carriers generated by light energy being received; and
    a second transistor, with said carrier storage region and the control electrode region of said first transistor as the source and drain regions, for transferring carriers stored in said carrier storage region to the control electrode region of said first transistor.

2. The photoelectric conversion device according to claim 1, further comprising a capacitor and an electrode in an insulation film on at least a part of the control electrode region of said first transistor, said control electrode region being controlled by the voltage control of said electrode.

3. The photoelectric conversion device according to claim 1, wherein said cell includes a third transistor for resetting the conduction between said carrier storage regions, and wherein photoelectric conversion cells are arranged in a matrix, adjacent carrier storage regions between pixels in an array direction different from an array direction of said second transistor acting as the source and drain regions.

4. The photoelectric conversion device according to claim 1, wherein said first transistor is commonly used among a plurality of pixels.

5. The photoelectric conversion device according to claim 1, wherein a plurality of pixels are provided, and in said second transistor are turned on concurrently for all the pixels.

6. The photoelectric conversion device according to claim 5, wherein a signal of each pixel is read sequentially after said second transistors are turned on for all the pixels.

7. A signal communication system having the photoelectric conversion device according to claim 1.

8. The signal communication system according to claim 7, wherein said system further comprises a central processing unit for controlling said photoelectric conversion device.

9. The signal communication system according to claim 7, further comprising a recording head.

10. A photoelectric conversion method using a photoelectric conversion device comprising a photoelectric conversion cell, as an individual single pixel, comprising the step of:
    selecting a first transistor having a control electrode region consisting of a semiconductor of one conduction type, and first and second main electrode regions consisting of a semiconductor of opposite conduction type of said one conduction type, for outputting a signal from said first main electrode region based on carriers transferred to said control electrode region;
    providing a carrier storage region adjacent said first transistor, consisting of a semiconductor of said one conduction type for storing carriers generated by light energy received;
    selecting a second transistor, having a carrier storage region and the control electrode region of said transistor as the source and drain regions, for transferring carriers stored in said carrier storage region to the control electrode region of said transistor,
    setting said carrier storage region and said control electrode region to initial voltages by allowing said second transistor to conduct;
    storing carriers generated by light illumination in said carrier storage region;
    transferring carriers stored in said carrier storage region to said control electrode region, by allowing said second transistor to conduct; and
    reading the voltage of said control electrode region determined by transferred carriers.

* * * * *

UNITED STATES PATENT AND TRADEMARK OFFICE
CERTIFICATE OF CORRECTION

PATENT NO. : 5,386,108
DATED : January 31, 1995
INVENTOR(S) : Shiro Arikawa et al It is certified that error appears in the above-indentified patent and that said Letters Patent is hereby corrected as shown below:

COLUMN 1

Line 48, "$n^{30}$ layer" should read --$n^+$ layer--; and

Line 50, "$n^{31}$" should read --$n^-$--.

COLUMN 3

Line 36, "the" (first occurrence) should be deleted;

Line 37, "$C_{bc} + C_{ox}$" should read --$C_{bc} + C_{OX}$--;

Line 41, ".area," should read --area,--; and

Line 42, "$H_{FE}$" should read --$h_{FE}$--.

COLUMN 4

Line 47, "conversion using," should read --conversion, using--.

COLUMN 8

Line 29, "device" should read --devices--;

Line 33, close up right margin; and

Line 40, "photodiode" should read --the photodiode--.

UNITED STATES PATENT AND TRADEMARK OFFICE
CERTIFICATE OF CORRECTION

PATENT NO. : 5,386,108
DATED : January 31, 1995
INVENTOR(S) : Shiro Arikawa et al It is certified that error appears in the above-indentified patent and that said Letters Patent is hereby corrected as shown below:

COLUMN 10

Line 5, "the" should be deleted;

Line 11, "1E20/cm$^3$" should read --1E20/cm$^3$,--; and

Line 14, "5E15/cm$^3$" should read --5E15/cm$^3$,--.

COLUMN 11

Line 2, "1E16/cm" should read --1E16/cm$^2$--; and

Line 50, "the" (first occurrence) should be deleted.

COLUMN 12

Line 64, "Are" should read --are--.

COLUMN 14

Line 50, "such" should be deleted and "pizel" should read --pixel--.

UNITED STATES PATENT AND TRADEMARK OFFICE
CERTIFICATE OF CORRECTION

PATENT NO. : 5,386,108
DATED : January 31, 1995
INVENTOR(S) : Shiro Arikawa et al It is certified that error appears in the above-indentified patent and that said Letters Patent is hereby corrected as shown below:

<u>COLUMN 16</u>

Line 37, "step" should read --steps--; and
Line 54, "transistor," should read --transistor;--.

Signed and Sealed this

Sixteenth Day of May, 1995

Attest:

BRUCE LEHMAN

Attesting Officer   Commissioner of Patents and Trademarks